United States Patent
Yoshimura et al.

[11] Patent Number: 6,093,479
[45] Date of Patent: Jul. 25, 2000

[54] COATED HARD ALLOY BLADE MEMBER

[75] Inventors: Hironori Yoshimura; Akira Osada; Kenichi Unou; Takatoshi Oshika; Jun Sugawara; Yuuki Hamaguchi, all of Ibaraki-ken, Japan

[73] Assignee: Mitsubishi Materials Corporation, Tokyo, Japan

[21] Appl. No.: 09/210,460

[22] Filed: Dec. 14, 1998

Related U.S. Application Data

[62] Division of application No. 08/398,533, Mar. 6, 1995, Pat. No. 5,920,760.

[30] Foreign Application Priority Data

| May 31, 1994 | [JP] | Japan | 6-141100 |
| May 31, 1994 | [JP] | Japan | 6-141101 |
| May 31, 1994 | [JP] | Japan | 6-141122 |
| May 31, 1994 | [JP] | Japan | 6-141123 |
| Jun. 15, 1994 | [JP] | Japan | 6-156842 |
| Jun. 15, 1994 | [JP] | Japan | 6-156843 |
| Jun. 15, 1994 | [JP] | Japan | 6-156844 |
| Jun. 15, 1994 | [JP] | Japan | 6-156845 |
| Sep. 19, 1994 | [JP] | Japan | 6-249945 |

[51] Int. Cl.$^7$ .................................................. C23C 30/00
[52] U.S. Cl. ..................... 428/212; 428/469; 428/697; 428/698; 428/699; 428/701; 428/702
[58] Field of Search .................. 428/469, 698, 428/699, 697, 212, 701, 702

[56] References Cited

U.S. PATENT DOCUMENTS

| Re. 34,180 | 2/1993 | Nemeth et al. . |
| 4,401,719 | 8/1983 | Kobayashi et al. . |
| 4,474,849 | 10/1984 | Fujimori et al. . |
| 4,746,563 | 5/1988 | Nakano et al. . |
| 4,812,370 | 3/1989 | Okada et al. . |
| 4,830,930 | 5/1989 | Taniguchi et al. . |
| 5,066,553 | 11/1991 | Yoshimura et al. . |
| 5,071,696 | 12/1991 | Chatfield et al. . |
| 5,106,674 | 4/1992 | Okada et al. . |
| 5,296,016 | 3/1994 | Yoshimura et al. . |
| 5,372,873 | 12/1994 | Yoshimura et al. . |
| 5,374,471 | 12/1994 | Yoshimura et al. . |
| 5,436,071 | 7/1995 | Odani et al. . |
| 5,447,549 | 9/1995 | Yoshimura . |
| 5,487,625 | 1/1996 | Ljungberg et al. . |

FOREIGN PATENT DOCUMENTS

| 0 408 535 | 1/1991 | European Pat. Off. . |
| 0 594 875 | 5/1994 | European Pat. Off. . |
| 63-195268 | 8/1988 | Japan . |
| 6-108254 | 4/1994 | Japan . |
| 6-190605 | 7/1994 | Japan . |

*Primary Examiner*—Archene Turner
*Attorney, Agent, or Firm*—Oblon, Spivak, McClelland, Maier & Neustadt, P.C.

[57] ABSTRACT

A coated hard alloy blade member is disclosed which includes a substrate formed of a hard alloy of a WC-based cemented carbide or a TiCN-based cermet, and a hard coating deposited on the substrate. The hard coating includes an inner layer of TiCN having unilaterally grown crystals of an elongated shape and an outer layer of $Al_2O_3$ having a crystal form κ or κ+α wherein κ>α. The resulting blade member is highly resistant to wear and fracturing, and possesses cutting ability of a higher level.

28 Claims, 1 Drawing Sheet

TiN (OUTERMOST LAYER)

$Al_2O_3$ (OUTER LAYER)

TiCNO (SECOND INTERMEDIATE LAYER)

TiCN (INNER LAYER)

TiN (INNERMOST LAYER)

CEMENTED CARBIDE SUBSTRATE

COATED HARD ALLOY BLADE MEMBER

This application is a Division of application Ser. No. 08/398,533 Filed on Mar. 6, 1995, now allowed U.S. Pat. No. 5,920,760.

BACKGROUND OF THE INVENTION

1. Technical Field of the Invention

The present invention relates to coated hard alloy blade members or cutting tools having exceptional steel and cast iron cutting ability for both continuous and interrupted cutting.

2. Background Art

Until now, the use of a coated cemented carbide cutting tool made by using either chemical vapor deposition or physical vapor deposition to apply a coating layer of an average thickness of 0.5–20 μm comprised of either multiple layers or a single layer of one or more of titanium carbide, titanium nitride, titanium carbonitride, titanium oxycarbide, titanium oxycarbonitride, and aluminum oxide (hereafter indicated by TiC, TiN, TiCN, TiCO, TICNO, and $Al_2O_3$) onto a WC-based cemented carbide substrate for cutting steel or cast iron has been widely recognized.

The most important technological advance that led to the wide usage of the above-mentioned coated cemented carbide cutting tool was, as described in Japanese Patent Application No. 52-46347 and Japanese Patent Application No. 51-27171, the development of an exceptionally tough substrate wherein the surface layer of a WC-based cemented carbide substrate included a lot of Co, a binder metal, in comparison with the interior, whereby the fracture resistance of the coated cemented carbide cutting tool rapidly improved.

In addition, as disclosed in Japanese Patent Application No. 52-156303 and Japanese Patent Application No. 54-83745, the confirmation that, by sintering the WC-based cemented carbide containing nitrogen in a denitrifying atmosphere such as a vacuum, the surface layer of the WC-based cemented carbide substrate can be made from WC—Co which does not include a hard dispersed phase having a B-1 type crystal structure, whereby it is possible to cheaply produce WC-based cemented carbide having more Co in its surface layer than in the interior, was also important.

Concerning the advancement of the coating layer, coated cemented carbides having coating layers wherein the X-ray diffraction peaks of the Ti compounds such as TiC, TiN, and TiCN have a strong (200) orientation and the $Al_2O_3$ has an α-type crystal structure such as described in Japanese Patent Application No. 61-231416 and coated cemented carbides having coating layers wherein the X-ray diffraction peaks of the Ti compounds such as TiC, TiN, and TiCN have a strong (220) orientation and the $Al_2O_3$ has a κ-type crystal structure such as described in Japanese Patent Application No. 62-29263 have little variation in the tool life.

Furthermore, Japanese Patent Application No. 2-156663 shows that a coated cemented carbide having a coating layer wherein the TiC has a strong (111) orientation and the $Al_2O_3$ is of the κ-type has the features that there is less spalling of the coating layer and has a long life.

However, since the Ti compounds such as TiC of Japanese Patent Application No. 61-231416, Japanese Patent Application No. 62-29263, and Japanese Patent Application No. 2-156663 are coated by the normal CVD method, the crystal structure is in a granular form identical to the coating layers of the past, and the cutting ability was not always satisfactory.

Additionally, Japanese Patent Application No. 50-16171 discloses that coating is possible with the use of organic gas for a portion of the reaction gas, at a relatively low temperature. In this patent, the crystal structure of the coating layer is not described, and furthermore, the crystal structure may have a granular form, or the crystals may grow in one direction (elongated crystals) depending on the coating conditions. Moreover, in the references given in this patent, the coating layer is made up of only TiCN, and $Al_2O_3$ is not disclosed. Additionally, this TiCN had a low bonding strength with the substrate.

SUMMARY OF THE INVENTION

In recent years cutting technology has shown remarkable progress towards unmanned, high speed processes. Therefore, tools which are highly resistant to wear and fracturing are required. Consequently, the present inventors conducted research to develop a coated cemented carbide cutting tool having cutting ability of a higher level.

It was discovered that by coating the surface of a WC-based cemented carbide substrate and a TiCN-based cermet substrate with TiCN having crystals growing in one direction (elongated crystals) as an inner layer, and coating with $Al_2O_3$ having a crystal structure κ or κ+α wherein κ>α as an outer layer, remarkable steel and cast iron cutting ability was shown for both continuous cutting and interrupted cutting.

Thus, the coated hard alloy blade member in accordance with the present invention comprises a substrate formed of a hard alloy selected from the group consisting of a WC-based cemented carbide and a TiCN-based cermet, and a hard coating deposited on said substrate, the hard coating including an inner layer of TiCN having unilaterally grown crystals of an elongated shape and an outer layer of $Al_2O_3$ having a crystal form κ or κ+α wherein κ>α.

DETAILED DESCRIPTION OF THE INVENTION

Figure 1:
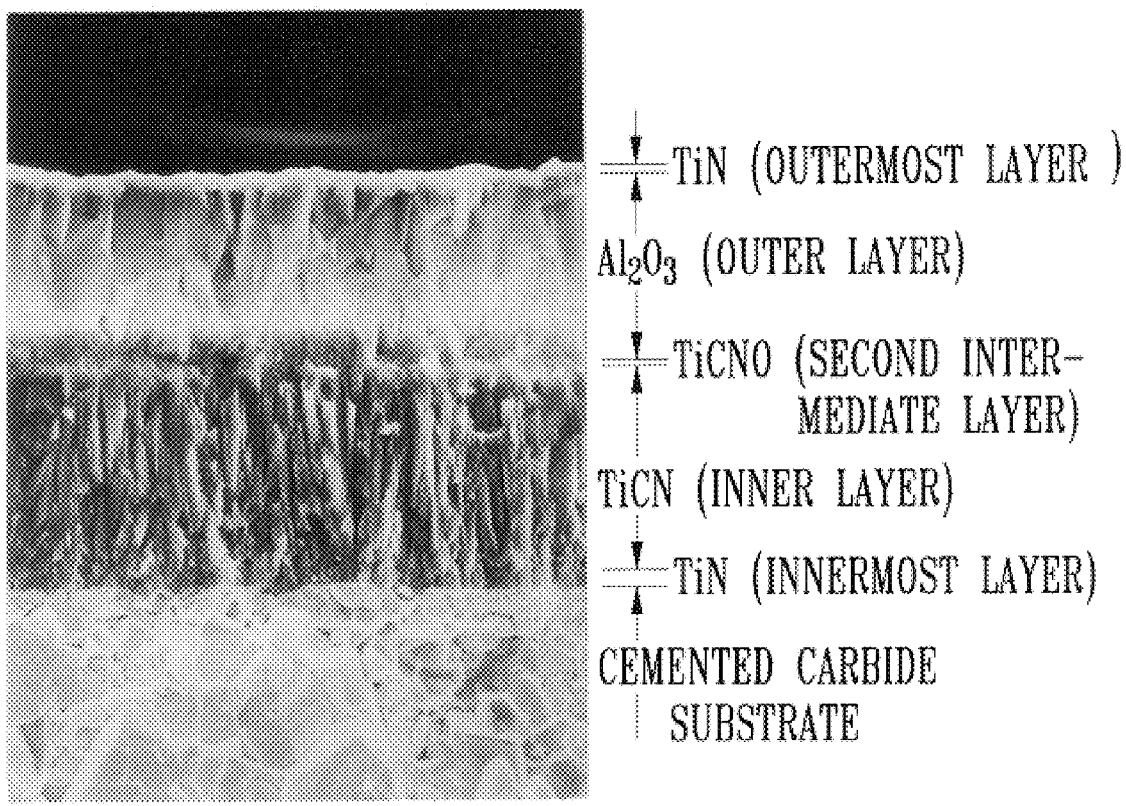
FIG. 1 is a photograph of a coated cemented carbide blade member in accordance with the present invention as taken by a scanning electron microscope.

The coated hard alloy blade member or cutting tool in accordance with the present invention will now be described in detail.

As mentioned before, the coated hard alloy blade member in accordance with the present invention comprises a substrate formed of a hard alloy selected from the group consisting of a WC-based cemented carbide and a TiCN-based cermet, and a hard coating deposited on said substrate, the hard coating including an inner layer of TiCN having unilaterally grown crystals of an elongated shape and an outer layer of $Al_2O_3$ having a crystal form κ or κ+α wherein κ>α.

In order to practicalize the present invention, it is first necessary to coat the substrate with elongated crystal TiCN having high bonding strength. If the conditions are such that, for example, during the coating of the TiCN, the percentages of the respective volumes are: $TiCl_4$: 1–10%, $CH_3CN$: 0.1–5%, $N_2$: 0–35%, $H_2$: the rest, the reaction temperature is 800–950 °C., the pressure is 30–500 Torr, and furthermore, the $CH_3CN$ gas is decreased to 0.01–0.1% at the beginning of the coating as a first coating reaction for 1–120 minutes, then the $CH_3CN$ gas is increased to 0.1–1% as a second coating reaction, then elongated crystal TiCN having high bonding strength can be obtained. The thickness of the TiCN coating layer should preferably be 1–20 μm. This is because at less than 1 μm the wear resistance worsens, and at more than 20 μm the fracture resistance worsens.

Furthermore, during the coating of the TiCN, if the reaction temperature or the amount of CH$_3$CN is increased, the (200) plane component of the X-ray diffraction pattern of the TiCN becomes weaker than the (111) and (220) plane components, the bonding strength with the Al$_2$O$_3$ in the upper layer which has κ as its main form increases, and the wear resistance goes up.

Next, Al$_2$O$_3$ of κ form or κ+α form wherein form κ>α is coated. For coating Al$_2$O$_3$ which has κ as its principal form, the conditions should be such that, for example, the reaction gas is made up of the following volume percentages in the first 1–120 minutes: AlCl$_3$: 1–20%, HCl: 1–20% and/or H$_2$S: 0.05–5% as needed, and H$_2$: the rest, and a first reaction be performed, then afterwards, a second reaction is performed in which AlCl$_3$: 1–20%, CO$_2$: 0.5–30%, HCl: 1–20% and/or H$_2$S: 0.05–5% as needed, and H$_2$: the rest, with the conditions of a reaction temperature of 850–1000° C. and pressure of 30–500 Torr.

The thickness of this Al$_2$O$_3$ coating layer should preferably be 0.1–10 μm. At less than 0.1 μm the wear resistance worsens, while at over 10 μm the fracturing resistance worsens.

The combined thickness of the first TiCN layer and the second Al$_2$O$_3$ layer should preferably be 2–30 μm.

The K ratio of the κ+α Al$_2$O$_3$ of the present invention uses a peak from Cu-Kα X-ray diffraction, and is determined the following equation, wherein if κ>α then the κ ratio is over 50%.

$$\kappa \text{ ratio } (\%) = \frac{I_{\kappa 2.79} + I_{\kappa 1.43}}{I_{\kappa 2.79} + I_{\kappa 1.43} + I_{\alpha 2.085} + I_{\alpha 1.601}} \times 100$$

wherein  
$I_{\kappa 2.79}$: The height of the X-ray diffraction peak for ASTM No. 4-0878 with a plane index spacing of d = 2.79  
$I_{\kappa 1.43}$: The height of the X-ray diffraction peak for ASTM No. 4-0878 with a plane index spacing of d = 1.43  
$I_{\alpha 2.085}$: The height of the X-ray diffraction peak for ASTM No. 10-173 with a plane index spacing of d = 2.085 (the (113) plane)  
$I_{\alpha 1.601}$: The height of the X-ray diffraction peak for ASTM No. 10-173 with a plane index spacing of d = 1.601 (the (116) plane)

As further modified embodiments of the present invention, the following are included.

(1) As an outermost layer, either one or both of TiN or TiCN may be coated on the outer Al$_2$O$_3$ layer. The reason for this coating layer is to discriminate between areas of use, and a thickness of 0.1–2 μm is preferable.

(2) As an innermost layer, either one or more of TiN, TiC, or TiCN (granular form) may be coated underneath the inner TiCN layer. By coating with this innermost layer, the bonding strength of the elongated crystal TiCN improves and the wear resistance improves. The most preferable thickness for this coating is 0.1–5 μm.

(3) Between the inner TiCN layer and the outer Al$_2$O$_3$ layer, either one or more of TiN, TiC, or TiCN (granular form) may be coated as a first intermediate layer. This first intermediate layer improves the wear resistance during low speed cutting. However, during high speed cutting, it worsens the wear resistance. The most preferable thickness for this first intermediate layer is 1–7 μm.

(4) Between the inner TiCN layer and the outer Al$_2$O$_3$ layer, either one or both of TiCO, TiCNO is coated as a second intermediate layer. This second intermediate layer increases the bonding strength between the elongated crystal TiCN and the κ or κ+α form Al$_2$O$_3$. The most preferable thickness of this second intermediate layer is 0.1–2μm.

(5) It is possible to combine the above-mentioned (1)–(4) as appropriate.

(6) The inner layer coated with elongated crystal TiCN may be divided by one or more TiN layers to define a divided TiCN layer. This divided TiCN layer is less susceptible to chipping, and the fracture resistance improves.

(7) With the divided elongated TiCN described above and the κ or κ+α form Al$_2$O$_3$, it is possible to coat with an outermost layer of one or both of TiN or TiCN as in (1) above, coat with an innermost layer of one or more of TiN, TiC, or TiCN as in (2) above, coat with a first intermediate layer of one or more of TiC, TiN, or TiCN as in (3) above, coat with a second intermediate layer of one or both of TiCO or TiCNO as in (4) above, or to take a combination of them.

(8) The most preferable composition of the WC-based cemented carbide substrate is, by the percentage of weight, as follows:

| Co: | 4–12% | Ti: | 0–7% | Ta: | 0–7% |
|---|---|---|---|---|---|
| Nb: | 0–4% | Cr: | 0–2% | | |
| N: | 0–1% | W and C: | the rest | | |

Unavoidable impurities such as O, Fe, Ni, and Mo are also included.

(9) For the WC-based cemented carbide of the present invention, for lathe turning of steel, it is preferable that the cemented carbide be such that the amount of Co or Co+Cr in the surface portion (the highest value from the surface to within 100 μm) be 1.5 to 5 times the amount in the interior (1 mm from the surface), and for lathe turning of cast iron, it is preferable that there is no enrichment of the Co or Co+Cr, and that the amount of Co or Co+Cr be small. Furthermore, in the case of steel milling, cemented carbide in which there has been no enrichment of the Co or Co+Cr, and the amount of Co or Co+Cr is large, is preferable.

(10) The most preferable composition of the TiCN-based cermet substrate is, by the percentage of weight, as follows:

| Co: | 2–14% | Ni: | 2–12% | Ta: | 2–20% |
|---|---|---|---|---|---|
| Nb: | 0.1–10% | W: | 5–30% | Mo: | 5–20% |
| N: | 2–8% | Ti and C: | the rest | | |
| Cr, V, Zr, Hf: | 0–5% | | | | |

Unavoidable impurities such as O and Fe are included.

(11) In the TiCN-based cermet of the present invention, the substrate surface layer (the largest value within 100 μm of the surface) should be 5% or more harder than the interior (1 mm from the surface) or there should be no difference between the hardnesses of the surface layer and the interior.

The present invention will be explained in more detail by way of the following examples.

EXAMPLE 1

As the raw materials, medium grain WC powder having an average particle size of 3 μm, 5 μm coarse grain WC powder, 1.5 μm (Ti, W)C (by weight ratio, TiC/WC=30/70) powder, 1.2 μm (Ti, W)(C, N) (TiC/TiN/WC=24/20/56) powder, 1.5 μm Ti(C, N) (TiC/TiN=50/50) powder, 1.6 μm (Ta, Nb)C (TaC/NbC=90/10) powder, 1.8 μm TaC powder, 1.1 μm Mo$_2$C powder, 1.7 μm ZrC powder, 1.8 μm Cr$_3$C$_2$ powder, 2.0 μm Ni powder, 2.2 μm NiAl (Al: 31% by weight) powder, and 1.2 μm Co powder were prepared, then these raw material powders were blended in the compositions shown in Table 1 and wet-mixed in a ball mill for 72 hours. After drying, they were press-shaped into green compacts of the form of ISO CNMG 120408 (cemented carbide substrates A–D, cermet substrates F–G) and SEEN 42 AFTN 1 (cemented carbide substrates E and E'), then these green compacts were sintered under the conditions described in Table 1, thus resulting in the production of cemented carbide substrates A–E, E' and cermet substrates F–G.

Experimental values taken at over 1 mm from the surface of the sintered compacts of the cemented carbide substrates A–E, E' and the cermet substrates F–G are as shown in Table 2.

Furthermore, in the case of the above cemented carbide substrate B, after maintenance in an atmosphere of CH$_4$ gas at 100 torr and a temperature of 1400° C. for 1 hour, a gradually cooling carburizing procedure was run, then, by removing the carbon and Co attached to the substrate surface using acid and barrel polishing, a Co-rich region 40 μm deep was formed in the substrate surface layer wherein, at a position 10 μm from the surface the maximum Co content was 15% by weight.

Additionally, in the case of cemented carbide substrates A and D above, while sintered, a Co-rich region 20 μm deep was formed wherein, at a position 15 μm from the surface, the maximum Co content was 1 1% and 9% by weight, respectively, and in the remaining cemented carbide substrates C, E and E', no Co-rich region was formed, and they had similar compositions over their entirety.

In the above cermet substrates F and G, in the sintered state, a surface layer harder than the interior existed. The hardnesses at the surface and 1 mm below the surface for the cermet substrates F and G are shown in Table 2.

Next, after honing the surfaces of the cemented carbide substrates A–E, E' and cermet substrates F and G, by forming coating layers under the special coating conditions shown in Tables 3(a) and 3(b) and having the compositions, crystal structures, orientation of TiCN (shown, starting from the left, in the order of the intensity of the corresponding X-ray diffraction peak) and average thicknesses shown in Table 4 by using a chemical vapor deposition apparatus, the coated cemented carbide cutting tools of the present invention 1–12 and 15–26, the coated cermet cutting tools of the present invention 13, 14, 27, and 28, the coated cemented carbide cutting tools of the prior art 1–12 and 15–26, and the coated cermet cutting tools 13, 14, 27, and 28 of the prior art were produced.

Then, for the coated cemented carbide cutting tools of the present invention 1–10 and 15–24, and the coated cemented carbide cutting tools of the prior art 1–10 and 15–24, a mild steel continuous cutting test was performed under the following conditions,

| | |
|---|---|
| Workpiece: | mild steel round bar |
| Cutting Speed: | 270 m/min |
| Feed: | 0.25 mm/rev |
| Depth of Cut: | 2 mm |
| Cutting Time: | 30 min | in which a determination was made whether or not the cutting failed due to tears made in the workpiece because of chipping of the cutting blade or spalling of the coating layer. Then, for those which were able to cut for the set period of time, the amount of flank wear was measured. Furthermore, an interrupted cutting test was performed under the following conditions,

| | |
|---|---|
| Workpiece: | mild steel round bar with groove |
| Cutting Speed: | 250 m/min |
| Feed: | 0.25 mm/rev |
| Depth of Cut: | 1.5 mm |
| Cutting Time: | 40 min | in which a determination was made whether or not the cutting failed due to trouble such as fracturing or chipping of the cutting blade. Then, for those which were able to cut for the set period of time, the amount of flank wear was measured.

For the coated cemented carbide cutting tools of the present invention 11, 12, 25 and 26, and the coated cemented carbide cutting tools of the prior art 11, 12, 25 and 26, a mild steel milling test was performed under the following conditions,

| | |
|---|---|
| Workpiece: | mild steel square block |
| Cutting Speed: | 250 m/min |
| Feed: | 0.35 mm/tooth |
| Depth of Cut: | 2.5 mm |
| Cutting Time: | 40 min | in which a determination was made whether or not the milling failed due to trouble such as chipping of the cutting blade. Then, for those which were able to cut for the set period of time, the amount of flank wear was measured.

For the coated cermet cutting tools of the present invention 13, 14, 27 and 28, and the coated cermet cutting tools of the prior art 13, 14, 27 and 28, a mild steel continuous cutting test was performed under the following conditions,

| | |
|---|---|
| Workpiece: | mild steel round bar |
| Cutting Speed: | 320 m/min |
| Feed: | 0.25 mm/rev |
| Depth of Cut: | 1 mm |
| Cutting Time: | 20 min | in which a determination was made whether or not the cutting failed due to chipping or fracturing of the cutting blade. Then, for those which were able to cut for the set period of time, the amount of flank wear was measured. Furthermore, an interrupted cutting test was performed under the following conditions,

| | |
|---|---|
| Workpiece: | mild steel round bar with groove |
| Cutting Speed: | 300 m/min |
| Feed: | 0.20 mm/rev |
| Depth of Cut: | 1 mm |
| Cutting Time: | 20 min | in which a determination was made whether or not the cutting failed due to trouble such as chipping of the cutting blade. Then, for those which were able to cut for the set period of time, the amount of flank wear was measured.

The results of the above tests are shown in Tables 4–7. As is able to be seen from Tables 4–7, all of the coated cemented carbide cutting tools and coated cermet cutting tools of the present invention demonstrate the properties that it is difficult to fracture or chip the cutting blades and spalling of the coating layers is rare, in addition to exhibiting superior wear and fracture resistance.

EXAMPLE 2

Using the same cemented carbide substrates A–E, E' and cermet substrates F and G as Example 1, under the same coating conditions as shown in Tables 3(a) and 3(b) in Example 1, by forming coating layers of the composition, crystal structures, and average thicknesses shown in Tables 8 and 9, the coated cemented carbide cutting tools of the present invention 29–40, the coated cermet cutting tools of the present invention 41 and 42, the coated cemented carbide cutting tools of the prior art 29–40, and the coated cermet cutting tools 41 and 42 of the prior art were produced.

Then, for the coated cemented carbide cutting tools of the present invention 29–38, and the coated cemented carbide cutting tools of the prior art 29–38, a mild steel continuous cutting test was performed under the following conditions,

| | |
|---|---|
| Workpiece: | mild steel round bar |
| Cutting Speed: | 250 m/min |
| Feed: | 0.27 mm/rev |
| Depth of Cut: | 2 mm |
| Cutting Time: | 30 min | and an appraisal identical to that of Example 1 was made. Furthermore, an interrupted cutting test was performed under the following conditions,

| | |
|---|---|
| Workpiece: | mild steel round bar with groove |
| Cutting Speed: | 230 m/min |
| Feed: | 0.27 mm/rev |
| Depth of Cut: | 1.5 mm |
| Cutting Time: | 40 min | and an appraisal identical to that of Example 1 was made.

For the coated cemented carbide cutting tools of the present invention 39 and 40, and the coated cemented carbide cutting tools of the prior art 39 and 40, a mild steel milling test was performed under the following conditions,

| | |
|---|---|
| Workpiece: | mild steel square block |
| Cutting Speed: | 230 m/min |
| Feed: | 0.37 mm/tooth |

| | |
|---|---|
| Depth of Cut: | 2.5 mm |
| Cutting Time: | 40 min | and an appraisal identical to that of Example 1 was made.

For the coated cermet cutting tools of the present invention 41 and 42, and the coated cermet cutting tools of the prior art 41 and 42, a mild steel continuous cutting test was performed under the following conditions,

| | |
|---|---|
| Workpiece: | mild steel round bar |
| Cutting Speed: | 300 m/min |
| Feed: | 0.27 mm/rev |
| Depth of Cut: | 1 mm |
| Cutting Time: | 20 min | and an appraisal identical to that of Example 1 was made. Furthermore, an interrupted cutting test was performed under the following conditions,

| | |
|---|---|
| Workpiece: | mild steel round bar with groove |
| Cutting Speed: | 280 m/min |
| Feed: | 0.22 mm/rev |
| Depth of Cut: | 1 mm |
| Cutting Time: | 20 min | and an appraisal identical to that of Example 1 was made.

The results of the above tests are shown in Tables 8, 9(a) and 9(b). As is able to be seen from Tables 8, 9(a) and 9(b), all of the coated cemented carbide cutting tools and coated cermet cutting tools of the present invention demonstrate the properties that it is difficult to fracture or chip the cutting blades and spalling of the coating layers is rare, in addition to exhibiting superior wear and fracture resistance.

EXAMPLE 3

Using the same cemented carbide substrates A–E, E' and cermet substrates F and G as Example 1, under the same coating conditions as shown in Tables 3(a) and 3(b) in Example 1, by forming coating layers of the composition, crystal structures, and average thickness shown in Tables 10–13, the coated cemented carbide cutting tools of the present invention 43–54 and 57–68, the coated cermet cutting tools of the present invention 55,56, 69 and 70, the coated cemented carbide cutting tools of the prior art 43–54 and 57–68, and the coated cermet cutting tools 55, 56, 69 and 70 of the prior art were produced. FIG. 1 shows a photograph of the surface layer of the coated cemented carbide cutting tool of the present invention as taken by a scanning electron microscope.

Then, for the coated cemented carbide cutting tools of the present invention 43–52 and 57–66, and the coated cemented carbide cutting tools of the prior art 43–52 and 57–66, a mild steel continuous cutting test was performed under the following conditions,

| | |
|---|---|
| Workpiece: | mild steel round bar |
| Cutting Speed: | 280 m/min |
| Feed: | 0.23 mm/rev |
| Depth of Cut: | 2 mm |

-continued

| | |
|---|---|
| Cutting Time: | 30 min | and an appraisal identical to that of Example 1 was made. Furthermore, an interrupted cutting test was performed under the following conditions,

| | |
|---|---|
| Workpiece: | mild steel round bar with groove |
| Cutting Speed: | 260 m/min |
| Feed: | 0.23 mm/rev |
| Depth of Cut: | 1.5 mm |
| Cutting Time: | 40 min | and an appraisal identical to that of Example 1 was made.

For the coated cemented carbide cutting tools of the present invention 53, 54, 67 and 68, and the coated cemented carbide cutting tools of the prior art 53, 54, 67 and 68, a mild steel milling test was performed under the following conditions,

| | |
|---|---|
| Workpiece: | mild steel square block |
| Cutting Speed: | 260 m/min |
| Feed: | 0.33 mm/tooth |
| Depth of Cut: | 2.5 mm |
| Cutting Time: | 40 min | and an appraisal identical to that of Example 1 was made.

For the coated cermet cutting tools of the present invention 55, 56, 69 and 70, and the coated cermet cutting tools of the prior art 55, 56, 69 and 70, a mild steel continuous cutting test was performed under the following conditions,

| | |
|---|---|
| Workpiece: | mild steel round bar |
| Cutting Speed: | 330 m/min |
| Feed: | 0.23 mm/rev |
| Depth of Cut: | 1 mm |
| Cutting Time: | 20 min | and an appraisal identical to that of Example 1 was made. Furthermore, an interrupted cutting test was performed under the following conditions,

| | |
|---|---|
| Workpiece: | mild steel round bar with groove |
| Cutting Speed: | 310 m/min |
| Feed: | 0.18 mm/rev |
| Depth of Cut: | 1 mm |
| Cutting Time: | 20 min | and an appraisal identical to that of Example 1 was made.

The results of the above tests are shown in Tables 10–13. As is able to be seen from Tables 10–13, all of the coated cemented carbide cutting tools and coated cermet cutting tools of the present invention demonstrate the properties that it is difficult to fracture or chip the cutting blades and spalling of the coating layers is rare, in addition to exhibiting superior wear and fracture resistance.

EXAMPLE 4

Using the same cemented carbide substrates A–E, E' and cermet substrates F and G as Example 1, under the same coating conditions as shown in Tables 3(a) and 3(b) in Example 1, by forming coating layers of the composition, crystal structures, and average thicknesses shown in Tables 14–17, the coated cemented carbide cutting tools of the present invention 71–82 and 85–96, the coated cermet cutting tools of the present invention 83, 84, 97 and 98, the coated cemented carbide cutting tools of the prior art 71–82 and 85–96, and the coated cermet cutting tools 83, 84, 97 and 98 of the prior art were produced.

Then, for the coated cemented carbide cutting tools of the present invention 71–80 and 85–94, and the coated cemented carbide cutting tools of the prior art 71–80 and 85–94, a mild steel continuous cutting test was performed under the following conditions,

| | |
|---|---|
| Workpiece: | mild steel round bar |
| Cutting Speed: | 260 m/min |
| Feed: | 0.26 mm/rev |
| Depth of Cut: | 2 mm |
| Cutting Time: | 30 min | and an appraisal identical to that of Example 1 was made. Furthermore, an interrupted cutting test was performed under the following conditions,

| | |
|---|---|
| Workpiece: | mild steel round bar with groove |
| Cutting Speed: | 240 m/min |
| Feed: | 0.26 mm/rev |
| Depth of Cut: | 1.5 mm |
| Cutting Time: | 40 min | and an appraisal identical to that of Example 1 was made.

For the coated cemented carbide cutting tools of the present invention 81, 82, 95 and 96, and the coated cemented carbide cutting tools of the prior art 81, 82, 95 and 96, a mild steel milling test was performed under the following conditions,

| | |
|---|---|
| Workpiece: | mild steel square block |
| Cutting Speed: | 240 m/min |
| Feed: | 0.36 mm/tooth |
| Depth of Cut: | 2.5 mm |
| Cutting Time: | 40 min | and an appraisal identical to that of Example 1 was made.

For the coated cermet cutting tools of the present invention 83, 84, 97 and 98, and the coated cermet cutting tools of the prior art 83, 84, 97 and 98, a mild steel continuous cutting test was performed under the following conditions,

| | |
|---|---|
| Workpiece: | mild steel round bar |
| Cutting Speed: | 310 m/min |
| Feed: | 0.26 mm/rev |
| Depth of Cut: | 1 mm |
| Cutting Time: | 20 min | and an appraisal identical to that of Example 1 was made. Furthermore, an interrupted cutting test was performed under the following conditions, and an appraisal identical to that of Example 1 was made.

The results of the above tests are shown in Tables 14–17. As is able to be seen from Tables 14–17, all of the coated cemented carbide cutting tools and coated cermet cutting tools of the present invention demonstrate the properties that it is difficult to fracture or chip the cutting blades and spalling of the coating layers is rare, in addition to exhibiting superior wear and fracture resistance.

EXAMPLE 5

Using the same cemented carbide substrates A–E, E' and cermet substrates F and G as Example 1, under the same coating conditions as shown in Tables 3(a) and 3(b) in Example 1, by forming coating layers of the composition, crystal structures, and average thicknesses shown in Tables 18–21, the coated cemented carbide cutting tools of the present invention 99–112 and 122–126, the coated cermet cutting tools of the present invention 113–121, the coated cemented carbide cutting tools of the prior art 99–112 and 122–126, and the coated cermet cutting tools 113–121 of the prior art were produced.

Then, for the coated cemented carbide cutting tools of the present invention 99–112, and the coated cemented carbide cutting tools of the prior art 99–112, a mild steel high-feed continuous cutting test was performed under the following conditions,

| Workpiece: | mild steel round bar |
|---|---|
| Cutting Speed: | 210 m/min |
| Feed: | 0.38 mm/rev |
| Depth of Cut: | 2 mm |
| Cutting Time: | 30 min | and an appraisal identical to that of Example 1 was made. Furthermore, a deep cut interrupted cutting test was performed under the following conditions,

| Workpiece: | mild steel round bar |
|---|---|
| Cutting Speed: | 210 m/min |
| Feed: | 0.23 mm/rev |
| Depth of Cut: | 4 mm |
| Cutting Time: | 40 min | and an appraisal identical to that of Example 1 was made.

For the coated cemented carbide cutting tools of the present invention 122–126, and the coated cemented carbide cutting tools of the prior art 122–126, a mild steel milling test was performed under the following conditions,

| Workpiece: | mild steel square block |
|---|---|
| Cutting Speed: | 260 m/min |
| Feed: | 0.33 mm/tooth |
| Depth of Cut: | 3 mm |
| Cutting Time: | 40 min | and an appraisal identical to that of Example 1 was made.

For the coated cermet cutting tools of the present invention 113–121, and the coated cermet cutting tools of the prior art 113–121, a mild steel continuous cutting test was performed under the following conditions,

| Workpiece: | mild steel round bar |
|---|---|
| Cutting Speed: | 340 m/min |
| Feed: | 0.22 mm/rev |
| Depth of Cut: | 1 mm |
| Cutting Time: | 20 min | and an appraisal identical to that of Example 1 was made. Furthermore, an interrupted cutting test was performed under the following conditions,

| Workpiece: | mild steel round bar with groove |
|---|---|
| Cutting Speed: | 320 m/min |
| Feed: | 0.17 mm/rev |
| Depth of Cut: | 1 mm |
| Cutting Time: | 20 min | and an appraisal identical to that of Example 1 was made.

The results of the above tests are shown in Tables 18–21. As is able to be seen from Tables 18–21, all of the coated cemented carbide cutting tools and coated cermet cutting tools of the present invention demonstrate the properties that it is difficult to fracture or chip the cutting blades and spalling of the coating layers is rare, in addition to exhibiting superior wear and fracture resistance.

Finally, the present applications claims the priorities of Japanese Patent Applications Nos. 6-141100, 6-141101, 6-141122 and 6-141123 filed May 31, 1994, Japanese Patent Applications Nos. 6-156842, 6-156843, 6-156844 and 6-156845 filed Jun. 15, 1994, and Japanese Patent Application (No. is not fixed yet) filed Sep. 19, 1994, which are all incorporated herein by reference.

TABLE 1

| | Blend Composition (% by weight) | | | | | | Sintering Conditions | | |
|---|---|---|---|---|---|---|---|---|---|
| Type | Co | (Ti, W)C | (Ti, W)CN | (Ta, Nb)C | $Cr_3C_2$ | WC | Pressure | Temperature (°C.) | Holding Time (hours) |
| Cemented Carbide | | | | | | | | | |

TABLE 1-continued

| Type | Blend Composition (% by weight) | | | | | | Sintering Conditions | | |
|---|---|---|---|---|---|---|---|---|---|
| | Co | (Ti, W)C | (Ti, W)CN | (Ta, Nb)C | $Cr_3C_2$ | WC | Pressure | Temperature (°C.) | Holding Time (hours) |
| Substrate | | | | | | | | | |
| A | 6 | — | 6 | 4 | — | Balance (medium grain) | Vacuum (0.10 torr) | 1380 | 1 |
| B | 5 | 5 | — | 5 | — | Balance (medium grain) | Vacuum (0.05 torr) | 1450 | 1 |
| C | 9 | 8 | — | 5 | — | Balance (medium grain) | Vacuum (0.05 torr) | 1380 | 1.5 |
| D | 5 | — | 5 | 3 | — | Balance (medium grain) | Vacuum (0.05 torr) | 1410 | 1 |
| E | 10 | — | — | 2 | — | Balance (coarse grain) | Vacuum (0.05 torr) | 1380 | 1 |
| E | 10 | — | — | — | 0.7 | Balance (coarse grain) | Vacuum (0.05 torr) | 1360 | 1 |
| Cermet Substrate | | | | | | | | | |
| F | 30.2 TiC-23 TiN-10 TaC-13 WC-10 $Mo_2C$-0.5 ZrC-8 C-5 Ni-0.3 NiAl | | | | | | Vacuum (0.10 torr) | 1500 | 1.5 |
| G | 57 TiCN-10 TaC-1 NbC-9 WC-9 $Mo_2C$-7 Co-7 Ni | | | | | | $N_2$ Atmosphere (10 torr) | 1520 | 1.5 |

TABLE 2

| | Composition of Sintered Body (% by weight) | Hardness | |
|---|---|---|---|
| | | Interior (HRA) | Surface (HRA) |
| Cemented Carbide Substrate | | | |
| A | 6.1 Co-2.1 Ti-3.4 Ta-0.4 Nb-Rest (W + C) | 90.5 | — |
| B | 5.2 Co-1.2 Ti-4.2 Ta-0.4 Nb-Rest (W + C) | 91.0 | — |
| C | 9.0 Co-1.9 Ti-4.3 Ta-0.4 Nb-Rest (W + C) | 90.3 | — |
| D | 5.2 Co-1.7 Ti-2.5 Ta-0.3 Nb-Rest (W + C) | 91.1 | — |
| E | 9.8 Co-1.7 Ta-0.2 Nb-Rest (W + C) | 89.7 | — |
| E | 9.8 Co-0.6 Cr-Rest (W + C) | 89.8 | — |
| Cermet Substrate | | | |
| F | 9.4 Ta-12.2 W-9.4 Mo-0.4 Zr-7.9 Co-5.1 Ni-0.1 Al-3.8 N-Rest (Ti + C) | 91.7 | 92.2 |
| G | 9.5 Ta-0.9 Nb-8.5 W-8.5 Ho-7.1 Co-7.0 Ni-6.8 N-Rest (Ti + C) | 91.6 | 92.6 |

TABLE 3(a)

[Coating Conditions]

| Composition | X-ray Orientation | Gas Composition (% by volume) | Temperature (°C.) | Pressure (Torr) |
|---|---|---|---|---|
| Innermost Layer Granular TiC | | $TiCl_4$:2, $CH_4$:5, $H_2$:Rest | 1020 | 50 |
| Innermost Layer Granular TiN | | $TiCl_4$:2, $N_2$:25, $H_2$:Rest | 920 | 50 |
| Innermost Layer Granular TiCN | | $TiCl_4$:2, $CH_4$:4, $N_2$:20, $H_2$:Rest | 1020 | 50 |
| Inner Layer Elongated TiCN | (111) (220) (200) | First Reaction- $TiCl_4$:2, $CH_3CN$:0.05, $N_2$:20, $H_2$:Rest Second Reaction- $TiCl_4$:2, $CH_3CN$:0.6, $N_2$:20, $H_2$:Rest | 860 | 50 |
| Inner Layer Elongated TiCN | (220) (111) (200) | First Reaction- $TiCl_4$:2, $CH_3CN$:0.05, $N_2$:20, $H_2$:Rest Second Reaction- $TiCl_4$:2, $CH_3CN$:0.6, $N_2$:20, $H_2$:Rest | 900 | 50 |
| Inner Layer Elongated TiCN | (111) (200) (220) | First Reaction- $TiCl_4$:2, $CH_3CN$:0.05, $N_2$:20, $H_2$:Rest Second Reaction- $TiCl_4$:2, $CH_3CN$:0.3, $N_2$:20, $H_2$:Rest | 860 | 50 |
| Inner Layer Elongated TiCN | (220) (200) (111) | First Reaction- $TiCl_4$:4, $CH_3CN$:0.05, $N_2$:20, $H_2$:Rest Second Reaction- $TiCl_4$:4, $CH_3CN$:0.3, $N_2$:20, $H_2$:Rest | 900 | 50 |
| Inner Layer Granular TiCN | (111) (200) (220) | $TiCl_4$:4, $CH_4$:6, $N_2$:2, $H_2$:Rest | 1050 | 500 |
| Inner Layer Granular TiCN | (220) (200) (111) | $TiCl_4$:4, $CH_4$:4, $N_2$:2, $H_2$:Rest | 1050 | 500 |
| Inner Layer Granular TiCN | (200) (220) (111) | $TiCl_4$:4, $CH_4$:2, $N_2$:2, $H_2$:Rest | 1000 | 100 |
| Divided Layer Granular TiN | | $TiCl_4$:2, $N_2$:25, $H_2$:Rest | 900 | 200 |
| Divided Layer Granular TiN | | $TiCl_4$:2, $N_2$:25, $H_2$:Rest | 860 | 200 |
| First Intermediate Layer Granular TiC | | $TiCl_4$:2, $CH_4$:5, $H_2$:Rest | 1020 | 50 |
| First Intermediate Layer Granular TiCN | | $TiCl_4$:2, $CH_4$:4, $N_2$:20, $H_2$:Rest | 1020 | 50 |
| Second Intermediate Layer Granular TiCO | | $TiCl_4$:4, CO:6. $H_2$:Rest | 960 | 50 |
| Second Intermediate Layer Granular TiCNO | | $TiCl_4$:4, $CH_4$:2, $N_2$:1.5, $CO_2$:0.5, $H_2$:Rest | 1000 | 50 |

TABLE 3(b)

| Composition | X-ray Orientation | Gas Composition (% capacity) | Temperature (°C.) | Pressure (Torr) |
|---|---|---|---|---|
| Outer Layer $Al_2O_3$ | 100%κ | First Reaction-$AlCl_3$:3%, $H_2$:Rest<br>Second Reaction-$AlCl_3$:3%, $CO_2$:5%, $H_2S$:0.3, $H_2$:Rest | 970 | 50 |
| Outer Layer $Al_2O_3$ | 94%κ | First Reaction-$AlCl_3$:3%, $H_2$:Rest<br>Second Reaction-$AlCl_3$:3%, $CO_2$:5%, $H_2$:Rest | 970 | 50 |
| Outer Layer $Al_2O_3$ | 85%κ | First Reaction-$AlCl_3$:3%, $H_2$:Rest<br>Second Reaction-$AlCl_3$:3%, $CO_2$:6%, $H_2S$:0.2, $H_2$:Rest | 980 | 50 |
| Outer Layer $Al_2O_3$ | 73%κ | First Reaction-$AlCl_3$:3%, $H_2$:Rest<br>Second Reaction-$AlCl_3$:3%, $CO_2$:6%, $H_2$:Rest | 980 | 50 |
| Outer Layer $Al_2O_3$ | 62%κ | First Reaction-$AlCl_3$:3%, $H_2$:Rest<br>Second Reaction-$AlCl_3$:3%, $CO_2$:7%, $H_2S$:0.2, $H_2$:Rest | 990 | 50 |
| Outer Layer $Al_2O_3$ | 55%κ | First Reaction-$AlCl_3$:3%, $H_2$:Rest<br>Second Reaction-$AlCl_3$:3%, $CO_2$:8%, $H_2$:Rest | 1000 | 50 |
| Outer Layer $Al_2O_3$ | 40%κ | First Reaction-$AlCl_3$:3%, $H_2S$:0.05, $H_2$:Rest<br>Second Reaction-$AlCl_3$:3%, $CO_2$:9%, $H_2S$:0.1, $H_2$:Rest | 1010 | 50 |
| Outer Layer $Al_2O_3$ | 100%α | $AlCl_3$:3%, $CO_2$:10%, $H_2$:Rest | 1020 | 100 |
| Outermost Layer Granular TiN | | $TiCl_4$:2, $N_2$:30, $H_2$:Rest | 1020 | 200 |
| Outermost Layer Granular TiN | | $TiCl_4$:2, $CH_4$:4, $N_2$:20, $H_2$:Rest | 1020 | 200 |

TABLE 4

| | | Hard Coating Layer | | | | | | | Flank Wear (mm) | |
|---|---|---|---|---|---|---|---|---|---|---|
| | | Inner Layer | | | Outer Layer | | Outermost Layer | | | |
| Type | Substrate Symbol | Composition | Crystal Structure | Orientation | Composition | Crystal Structure | Composition | Crystal Structure | Continuous Cutting | Interrupted Cutting |
| Coated Cementing Carbide Cutting of the Invention | | | | | | | | | | |
| 1 | A | TiCN(8.4) | Elongated Growth | (111) (220) (200) | $Al_2O_3$(2.2) | κ:94% | TiN(0.5) | Granular | 0.17 | 0.26 |
| 2 | A | TiCN(5.5) | Elongated Growth | (220) (111) (200) | $Al_2O_3$(6.2) | κ:85% | | | 0.19 | 0.28 |
| 3 | A | TiCN(11.4) | Elongated Growth | (111)(220)(200) | $Al_2O_3$(1.8) | κ:100% | TiCN-TiN(0.7) | Granular | 0.19 | 0.31 |
| 4 | B | TiCN(8.2) | Elongated Growth | (111)(200)(220) | $Al_2O_3$(2.1) | κ:100% | TiN(0.4) | Granular | 0.17 | 0.31 |
| 5 | B | TiCN(5.1) | Elongated Growth | (111) (220) (200) | $Al_2O_3$(5.2) | κ:73% | | | 0.21 | 0.26 |
| 6 | C | TiCN(10.2) | Elongated Growth | (220)(111)(200) | $Al_2O_3$(1.2) | κ:55% | TiN(0.3) | Granular | 0.22 | 0.31 |
| 7 | C | TiCN(5.4) | Elongated Growth | (220)(200)(111) | $Al_2O_3$(0.9) | κ:62% | TiN(0.6) | Granular | 0.26 | 0.34 |
| 8 | D | TiCN(6.4) | Elongated Growth | (111)(220) (200) | $Al_2O_3$(5.7) | κ:73% | TiN(0.2) | Granular | 0.16 | 0.26 |
| 9 | D | TiCN(3.7) | Elongated Growth | (220)(111)(200) | $Al_2O_3$(8.2) | κ:62% | | | 0.17 | 0.30 |

TABLE 4-continued

| | | Hard Coating Layer | | | | | | | Flank Wear (mm) | |
| --- | --- | --- | --- | --- | --- | --- | --- | --- | --- | --- |
| | | Inner Layer | | | Outer Layer | | Outermost Layer | | | |
| Type | Substrate Symbol | Composition | Crystal Structure | Orientation | Composition | Crystal Structure | Composition | Crystal Structure | Continuous Cutting | Interrupted Cutting |
| 10 | D | TiCN(7.9) | Elongated Growth | (111)(220)(200) | Al$_2$O$_3$(2.5) | κ:100% | | | 0.18 | 0.26 |
| 11 | E | TiCN(4.2) | Elongated Growth | (220)(111) (200) | Al$_2$O$_3$(0.5) | κ:100% | | | 0.17 | (Milling) |
| 12 | E' | TiCN(4.0) | Elongated Growth | (111) (220) (200) | Al$_2$O$_3$(0.4) | κ:94% | TiN(0.3) | Granular | 0.19 | (Milling) |
| 13 | F | TiCN(4.6) | Elongated Growth | (220) (111) (200) | Al$_2$O$_3$(0.4) | κ:100% | TiN(0.4) | Granular | 0.16 | 0.29 |
| 14 | G | TiCN(3.2) | Elongated Growth | (111) (220) (200) | Al$_2$O$_3$(0.8) | κ:94% | TiN(0.2) | Granular | 0.16 | 0.27 |

TABLE 5

| Type | Substrate Symbol | Hard Coating Layer | | | | | | | Flank Wear (mm) | |
|---|---|---|---|---|---|---|---|---|---|---|
| | | Inner Layer | | | Outer Layer | | Outermost Layer | | | |
| | | Composition | Crystal Structure | Orientation | Composition | Crystal Structure | Composition | Crystal Structure | Continuous Cutting | Interrupted Cutting |
| Coated Cementing Carbide Cutting Tools of Prior Art | | | | | | | | | | |
| 1 | A | TiCN(8.5) | Granular | (111) (200) (220) | Al$_2$O$_3$(2.0) | α:100% | TiN(0.5) | Granular | 0.47 (Chipping) | 0.60 (Chipping) |
| 2 | A | TiCN(5.4) | Granular | (220) (200) (111) | Al$_2$O$_3$(6.0) | α:100% | | | 0.52 (Chipping) | 0.56 (Chipping) |
| 3 | A | TiCN(11.3) | Granular | (111) (200) (220) | Al$_2$O$_3$(1.9) | κ:40% | TiCN-TiN(0.8) | Granular | 0.52 (Chipping) | 0.65 (Chipping) |
| 4 | B | TiCN(8.1) | Granular | (200) (220) (111) | Al$_2$O$_3$(2.2) | α:100% | TiN(0.3) | Granular | Failure after 12.8 min. due to Layer Separation | Failure 7.5 min. due to Layer Separation |
| 5 | B | TiCN(4.9) | Granular | (111) (200) (220) | Al$_2$O$_3$(5.2) | α:100% | | | Failure after 10.7 min. due to Layer Separation | Failure 5.3 min. due to Layer Separation |
| 6 | C | TiCN(10.3) | Granular | (220) (200) (111) | Al$_2$O$_3$(1.1) | α:100% | TiN(0.4) | Granular | Failure after 5.6 min. due to Layer Separation | Failure 0.8 min. due to Fracturing |
| 7 | C | TiCN(5.5) | Granular | (200) (220) (111) | Al$_2$O$_3$(1.1) | κ:40% | TiN(0.5) | Granular | Failure after 10.4 min. due to Layer Separation | Failure 3.2 min. due to Fracturing |
| 8 | D | TiCN(6.5) | Granular | (111) (200) (220) | Al$_2$O$_3$(5.6) | α:100% | TiN(0.3) | Granular | Failure after 17.1 min. due to Chipping | Failure 7.9 min. due to Chipping |
| 9 | D | TiCN(3.8) | Granular | (220) (200) (111) | Al$_2$O$_3$(6.4) | κ:40% | | | Failure after 15.4 min. due to Chipping | Failure 5.2 min. due to Chipping |
| 10 | D | TiCN(7.7) | Granular | (111) (200) (220) | Al$_2$O$_3$(2.4) | α:100% | | | Failure after 13.6 min. due to Chipping | Failure 7.0 min. due to Chipping |
| 11 | E | TiCN(4.1) | Granular | (220) (200) (111) | Al$_2$O$_3$(0.6) | α:100% | | | Failure after 20.8 min. due to Chipping (Milling) | |
| 12 | E' | TiCN(3.9) | Granular | (111) (200) (220) | Al$_2$O$_3$(0.3) | α:100% | TiN(0.2) | Granular | Failure after 17.7 min. due to Layer Separation (Milling) | |
| 13 | F | TiCN(4.4) | Granular | (220) (200) (111) | Al$_2$O$_3$(0.4) | α:100% | TiN(0.4) | Granular | Failure after 1.0 min. due to Chipping | Failure 0.1 min. due to Fracturing |
| 14 | G | TiCN(3.3) | Granular | (111) (200) (220) | Al$_2$O$_3$(0.9) | α:100% | TiN(0.3) | Granular | Failure after 2.8 min. due to Chipping | Failure 0.2 min. due to Fracturing |

TABLE 6

| Type | Substrate Symbol | Hard Coating Layer ||||||||| Flank Wear (mm) ||
| | | Innermost Layer || Inner Layer ||| Outer Layer || Outermost Layer || Continuous Cutting | Interrupted Cutting |
| | | Composition | Crystal Structure | Composition | Crystal Structure | Orientation | Composition | Crystal Structure | Composition | Crystal Structure | | |
|---|---|---|---|---|---|---|---|---|---|---|---|---|
| Coated Cemented Carbide Cutting Tools of the Invention | | | | | | | | | | | | |
| 15 | A | TiN (0.9) | Granular | TiCN (8.2) | Elongated Growth | (111) (220) (200) | $Al_2O_3$ (2.1) | κ:94% | TiN (0.8) | Granular | 0.13 | 0 |
| 16 | A | TiN (0.5) | Granular | TiCN (5.5) | Elongated Growth | (220) (111) (200) | $Al_2O_3$ (6.1) | κ:85% | | | 0.15 | 0 |
| 17 | A | TiCN (0.8) | Granular | TiCN (11.2) | Elongated Growth | (111) (200) (200) | $Al_2O_3$ (1.9) | κ:100% | TiCN-TiN (0.8) | Granular | 0.18 | 0 |
| 18 | B | TiC-TiN (1.5) | Granular | TiCN (6.3) | Elongated Growth | (111) (200) (220) | $Al_2O_3$ (2.0) | κ:100% | TiN (0.5) | Granular | 0.16 | 0 |
| 19 | B | TiN (1.5) | Granular | TiCN (4.8) | Elongated Growth | (111) (220) (200) | $Al_2O_3$ (5.5) | κ:73% | | | 0.17 | 0 |
| 20 | C | TiN (0.1) | Granular | TiCN (10.2) | Elongated Growth | (220) (111) (200) | $Al_2O_3$ (1.2) | κ:55% | TiN (0.3) | Granular | 0.17 | 0 |
| 21 | C | TiC (0.4) | Granular | TiCN (5.5) | Elongated Growth | (220) (200) (111) | $Al_2O_3$ (1.0) | κ:62% | TiN (0.5) | Granular | 0.20 | 0 |
| 22 | D | TiN (0.6) | Granular | TiCN (6.5) | Elongated Growth | (111) (220) (200) | $Al_2O_3$ (5.3) | κ:73% | | | 0.13 | 0 |
| 23 | D | TiN (1.2) | Granular | TiCN (3.9) | Elongated Growth | (220) (111) (200) | $Al_2O_3$ (8.1) | κ:62% | | | 0.16 | 0 |
| 24 | D | TiCN (0.6) | Granular | TiCN (7.8) | Elongated Growth | (111) (220) (200) | $Al_2O_3$ (2.4) | κ:100% | | | 0.17 | 0 |
| 25 | E | TiN (0.3) | Granular | TiCN (4.0) | Elongated Growth | (220) (111) (200) | $Al_2O_3$ (0.6) | κ:100% | | | 0.13 | (Milling) |
| 26 | E | TiN (0.3) | Granular | TiCN (3.5) | Elongated Growth | (111) (220) (200) | $Al_2O_3$ (0.4) | κ:94% | TiN (0.3) | Granular | 0.15 | (Milling) |
| 27 | F | TiN (0.7) | Granular | TiCN (4.5) | Elongated Growth | (220) (111) (200) | $Al_2O_3$ (0.3) | κ:100% | TiN (0.4) | Granular | 0.15 | 0.28 |
| 28 | G | TiN-TiCN (0.9) | Granular | TiCN (3.1) | Elongated Growth | (111) (220) (200) | $Al_2O_3$ (0.7) | κ:94% | TiN (0.2) | Granular | 0.14 | 0.27 |

TABLE 7 (a)

| | | Hard Coating Layer | | | | | | | | | Flank Wear (mm) | |
|---|---|---|---|---|---|---|---|---|---|---|---|---|
| | | Innermost Layer | | Inner Layer | | | Outer Layer | | Outermost Layer | | Continuous Cutting | Interrupted Cutting |
| Type | Substrate Symbol | Composition | Crystal Structure | Composition | Crystal Structure | Orientation | Composition | Crystal Structure | Composition | Crystal Structure | | |
| Coated Cemented Carbide Cutting Tools of the Invention | | | | | | | | | | | | |
| 15 | A | TiN (1.0) | Granular | TiCN (8.1) | Granular | (111) (200) (220) | $Al_2O_3$ (2.0) | α:100% | TiN (0.8) | Granular | 0.39 (Chipping) | 0.53 (Chipping) |
| 16 | A | TiN (0.5) | Granular | TiCN (5.3) | Granular | (220) (200) (111) | $Al_2O_3$ (6.0) | α:100% | | | 0.43 (Chipping) | 0.50 (Chipping) |
| 17 | A | TiCN (0.7) | Granular | TiCN (11.4) | Granular | (111) (200) (220) | $Al_2O_3$ (2.1) | κ:40% | TiCN-TiN (0.7) | Granular | 0.51 (Chipping) | 0.58 (Chipping) |
| 18 | B | TiC-TiN (1.4) | Granular | TiCN (8.4) | Granular | (200) (220) (111) | $Al_2O_3$ (1.9) | α:100% | TiN (0.4) | Granular | Failure after 13.2 min. due to Layer Separation | Failure after 8.1 min. due to Layer Separation |
| 19 | B | TiN (1.8) | Granular | TiCN (4.2) | Granular | (111) (200) (220) | $Al_2O_3$ (4.9) | α:100% | | | Failure after 14.5 min. due to Layer Separation | Failure after 7.5 min. due to Layer Separation |
| 20 | C | TiN (0.1) | Granular | TiCN (10.0) | Granular | (220) (200) (111) | $Al_2O_3$ (1.1) | α:100% | TiN (0.3) | Granular after 8.7 | Failure after 1.7 min. due to Layer Separation | Failure min. due to Fracturing |
| 21 | C | TiC (0.5) | Granular | TiCN (5.4) | Granular | (200) (220) (111) | $Al_2O_3$ (0.9) | κ:40% (0.5) | TiN | Granular after 10.8 | Failure after 3.7 min. due to Layer Separation | Failure min. due to Fracturing |
| 22 | D | TiN (0.4) | Granular | TiCN (6.7) | Granular | (111) (200) (220) | $Al_2O_3$ (5.0) | CL:100% | | | Failure after 20.2 min. due to Chipping | Failure after 10.1 due to Chipping |
| 23 | D | TiN (1.1) | Granular | TiCN (3.8) | Granular | (220) (200) (111) | $Al_2O_3$ (8.2) | κ:40% | | | Failure after 16.1 min. due to Chipping | Failure after 5.8 min. due to Chipping |
| 24 | D | TiCN (0.5) | Granular | TiCN (7.6) | Granular | (111) (200) (220) | $Al_2O_3$ (2.5) | α:100% | | | Failure after 14.4 min. due to Chipping | Failure after 7.6 min. due to Chipping |

TABLE 7 (b)

| | | Hard Coating Layer | | | | | | | | | Flank Wear (mm) | |
|---|---|---|---|---|---|---|---|---|---|---|---|---|
| | | Innermost Layer | | Inner Layer | | | Outer Layer | | Outermost Layer | | Con- | Inter- |
| Type | Substrate Symbol | Compo- sition | Crystal Structure | Compo- sition | Crystal Structure | Orientation | Compo- sition | Crystal Structure | Compo- sition | Crystal Structure | tinuous Cutting | rupted Cutting |
| Coated Cemented Carbide Cutting Tools of Prior Art | | | | | | | | | | | | |
| 25 | E | TiN (0.3) | Granular | TiCN (3.9) | Granular | (220) (200) (111) | Al₂O₃ (0.6) | α:100% | | | Failure after 26.7 min. due to Chipping (Milling) | |
| 26 | E' | TiN (0.3) | Granular | TiCN (3.4) | Granular | (111) (200) (220) | Al₂O₃ (0.4) | α:100% | TiN (0.3) | Granular | Failure after 23.3 min. due to Layer Separation (Milling) | |
| 27 | F | TiN (0.6) | Granular | TiCN (4.4) | Granular | (220) (200) (111) | Al₂O₃ (0.4) | α:100% | TiN (0.4) | Granular after 1.2 | Failure after 1.2 min. due to Chipping | Failure after 0.1 min. due to Fracturing |
| 28 | G | TiN-TiCN (1.0) | Granular | TiCN (3.2) | Granular | (111) (200) (220) | Al₂O₃ (0.8) | α:100% | TiN (0.3) | Granular after 3.0 | Failure after 0.2 min. due to Chipping | Failure after min. due to Fracture |

TABLE 8

| | | Hard Coating Layer | | | | | | | | | | | Flank Wear (mm) | |
|---|---|---|---|---|---|---|---|---|---|---|---|---|---|---|
| | | Innermost Layer | | Inner Layer | | | First Intermediate Layer | | Outer Layer | | Outermost Layer | | | |
| | Sub- strate Sym- bol | | Crystal Struc- ture | | Crystal Structure | Orienta- tion | | Crystal Struc- ture | | Crystal Struc- ture | | Crystal Struc- ture | Conti- nuous Cutting | Inter- rupted Cutting |
| Type | | Compo- sition | | Compo- sition | | | Compo- sition | | Compo- sition | | Compo- sition | | | |
| Coated Cemented Carbide Cutting Tools of the Invention | | | | | | | | | | | | | | |
| 29 | A | TiN (0.9) | Granular | TiCN (6.5) | Elongated Growth | (111)(220) (200) | TiC (3.0) | Granular | Al₂O₃ (2.5) | κ: 94% | TiN (0.2) | Granular | 0.15 | 0.19 |
| 30 | A | TiN (0.5) | Granular | TiCN (3.0) | Elongated Growth | (220)(111) (200) | TiC (2.4) | Granular | Al₂O₃ (6.0) | κ: 85% | | | 0.18 | 0.18 |
| 31 | A | | | TiCN (9.3) | Elongated Growth | (111)(220) (200) | TiC (2.3) | Granular | Al₂O₃ (2.1) | κ: 100% | TiCN-TiN (0.8) | Granular | 0.18 | 0.29 |
| 32 | B | TiC-TiN (1.1) | Granular | TiCN (4.5) | Elongated Growth | (111)(200) (220) | TiC (3.9) | Granular | Al₂O₃ (1.7) | κ: 100% | TiN (0.2) | Granular | 0.15 | 0.28 |
| 33 | B | TiN (1.6) | Granular | TiCN (4.9) | Elongated Growth | (111)(220) (200) | TiC (1.0) | Granular | Al₂O₃ (4.0) | κ: 73% | | | 0.19 | 0.20 |

TABLE 8-continued

| | | Hard Coating Layer | | | | | | | | | | Flank Wear (mm) | |
|---|---|---|---|---|---|---|---|---|---|---|---|---|---|
| | Sub- | Innermost Layer | | Inner Layer | | | First Intermediate Layer | | Outer Layer | | Outermost Layer | | |
| | strate | | Crystal | | | | | Crystal | | Crystal | | Crystal | Conti- | Inter- |
| Type | Symbol | Composition | Structure | Composition | Crystal Structure | Orientation | Composition | Structure | Composition | Structure | Composition | Structure | nuous Cutting | rupted Cutting |
| 34 | C | TiN (0.1) | Granular | TiCN (6.8) | Elongated Growth | (220)(111) (200) | TiC (3.2) | Granular | Al₂O₃ (1.2) | κ: 55% | TiN (0.3) | Granular | 0.25 | 0.25 |
| 35 | C | TiC (0.7) | Granular | TiCN (3.3) | Elongated Growth | (220)(200) (111) | TiN (1.9) | Granular | Al₂O₃ (0.9) | κ: 62% | TiN (0.3) | Granular | 0.25 | 0.25 |
| 36 | D | TiN (0.6) | Granular | TiCN (3.6) | Elongated Growth | (111)(220) (200) | TiC (2.8) | Granular | Al₂O₃ (5.2) | κ: 73% | | | 0.15 | 0.20 |
| 37 | D | | | TiCN (2.6) | Elongated Growth | (220)(111) (1.0) | TiCN (8.0) | Granular | Al₂O₃ | κ: 62% | | | 0.16 | 0.27 |
| 38 | D | TiCN (0.4) | Granular | TiCN (5.6) | Elongated Growth | (111)(220) (200) | TiC (2.3) | Granular | Al₂O₃ (2.7) | κ: 100% | | | 0.16 | 0.24 |
| 39 | E | TiN (0.3) | Granular | TiCN (2.5) | Elongated Growth | (220)(111) (200) | TiC (1.5) | Granular | Al₂O₃ (0.5) | κ: 100% | | | 0.15 | (Milling) |
| 40 | E' | | | TiCN (2.7) | Elongated Growth | (111)(220) (200) | TiC (1.6) | Granular | Al₂O₃ (0.3) | κ: 94% | TiN (0.2) | Granular | 0.14 | (Milling) |
| 41 | F | | | TiCN (3.5) | Elongated Growth | (220)(111) (200) | TiCN (1.3) | Granular | Al₂O₃ (0.4) | κ: 100% | TiN (0.2) | Granular | 0.16 | 0.26 |
| 42 | G | TiN-TiCN (1.0) | Granular | TiCN (1.7) | Elongated Growth | (111)(220) (200) | TiC (1.0) | Granular | Al₂O₃ (0.6) | κ: 94% | TiN (0.3) | Granular | 0.14 | 0.24 |

TABLE 9 (a)

| | | Hard Coating Layer | | | | | | | | | | | |
|---|---|---|---|---|---|---|---|---|---|---|---|---|---|
| | Sub-strate | Innermost Layer | | Inner Layer | | | First Intermediate Layer | | Outer Layer | | Outermost Layer | | Flank Wear (mm) | |
| Type | Symbol | Composition | Crystal Structure | Composition | Crystal Structure | Orientation | Composition | Crystal Structure | Composition | Crystal Structure | Composition | Crystal Structure | Continuous Cutting | Interrupted Cutting |
| Coated Cemented Carbide Cutting Tools of Prior Art | | | | | | | | | | | | | | |
| 29 | A | TiN (1.0) | Granular | TiCN (9.3) | Granular | (111)(200)(220) | TiC (2.5) | Granular | $Al_2O_3$ (2.5) | α: 100% | TiN (0.2) | Granular | 0.43 (Chipping) | 0.54 (Chipping) |
| 30 | A | TiN (0.5) | Granular | TiCN (3.1) | Granular | (220)(200)(111) | TiC (2.1) | Granular | $Al_2O_3$ (5.6) | α: 100% | | | 0.50 (Chipping) | 0.53 (Chipping) |
| 31 | A | | | TiCN (9.5) | Granular | (111)(200)(220) | TiC (2.1) | Granular | $Al_2O_3$ (2.1) | κ: 40% | TiCN-TiN (0.6) | Granular | 0.50 (Chipping) | 0.48 (Chipping) |
| 32 | B | TiC-TiN (1.2) | Granular | TiCN (4.7) | Granular | (200)(220)(111) | TiC (4.0) | Granular | $Al_2O_3$ (1.8) | α: 100% | TiN (0.2) | Granular | Failure after 13.9 min. due to Layer Separation | Failure after 8.8 min. due to Layer Separation |
| 33 | B | TiN (1.7) | Granular | TiCN (4.8) | Granular | (111)(200)(220) | TiC (1.2) | Granular | $Al_2O_3$ (3.9) | α: 100% | | | Failure after 11.1 min. due to Layer Separation | Failure after 6.2 min. due to Layer Separation |
| 34 | C | TiN (0.1) | Granular | TiCN (5.8) | Granular | (220)(200)(111) | TiC (2.5) | Granular | $Al_2O_3$ (1.1) | α: 100% | TiN (0.3) | Granular | Failure after 6.8 min. due to Layer Separation | Failure after 1.4 min. due to Fracturing |
| 35 | C | TiC (0.6) | Granular | TiCN (3.2) | Granular | (200)(220)(111) | TiN (1.8) | Granular | $Al_2O_3$ (1.0) | κ: 40% | TiN (0.4) | Granular | Failure after 11.6 min. due to Layer Separation | Failure after 4.1 min. due to Fracturing |
| 36 | D | TiN (0.4) | Granular | TiCN (3.5) | Granular | (111)(200)(220) | TiC (2.9) | Granular | $Al_2O_3$ (4.8) | α: 100% | | | Failure after 18.5 min. due to Chipping | Failure after 9.2 min. due to Chipping |
| 37 | D | | | TiCN (2.7) | Granular | (220)(200)(111) | TiCN (1.1) | Granular | $Al_2O_3$ (8.1) | κ: 40% | | | Failure after 16.8 min. due to Chipping | Failure after 6.4 min. due to Chipping |
| 38 | D | TiCN (0.5) | Granular | TiCN (5.7) | Granular | (111)(200)(220) | TiC (2.5) | Granular | $Al_2O_3$ (2.7) | α: 100% | | | Failure after 14.7 min. due to Chipping | Failure after 8.2 min. due to Chipping |

TABLE 9 (a)-continued

| | | Hard Coating Layer | | | | | | | | | | Flank Wear (mm) | |
|---|---|---|---|---|---|---|---|---|---|---|---|---|---|
| | Substrate | Innermost Layer | | | | First Intermediate Layer | | Outer Layer | | Outermost Layer | | | |
| | | | Crystal | Inner Layer | | | Crystal | | Crystal | | Crystal | Continuous | Interrupted |
| Type | Symbol | Composition | Structure | Composition | Crystal Structure | Orientation | Composition | Structure | Composition | Structure | Composition | Structure | Cutting | Cutting |
| | | | | | | | | | | | | | ping |

TABLE 9 (b)

| | | Hard Coating Layer | | | | | | | | | | Flank Wear (mm) | |
|---|---|---|---|---|---|---|---|---|---|---|---|---|---|
| | Substrate | Innermost Layer | | | | First Intermediate Layer | | Outer Layer | | Outermost Layer | | | |
| | | | Crystal | Inner Layer | | | Crystal | | Crystal | | Crystal | Continuous | Interrupted |
| Type | Symbol | Composition | Structure | Composition | Crystal Structure | Orientation | Composition | Structure | Composition | Structure | Composition | Structure | Cutting | Cutting |
| 39 | E | TiN (0.3) | Granular | TiCN (2.5) | Granular | (220)(200) (111) | TiC (1.4) | Granular | $Al_2O_3$ (0.5) | α: 100% | | | Failure after 19.7 min. due to Chipping (Milling) | |
| 40 | E' | | | TiCN (2.6) | Granular | (111)(200) (220) | TiC (1.5) | Granular | $Al_2O_3$ (0.4) | α: 100% | TiN (0.3) | Granular | Failure after 19.3 due to Layer Separation (Milling) | |
| 41 | F | | | TiCN (3.4) | Granular | (220)(200) (111) | TiCN (1.4) | Granular | $Al_2O_3$ (0.3) | α:100% | TiN (0.3) | Granular | Failure after 1.4 min. due to Chipping | Failure after 0.1 min. due to Fracturing |
| 42 | G | TiN-TiCN (0.9) | Granular | TiCN (1.9) | Granular | (111)(200) (220) | TiC (1.1) | Granular | $Al_2O_3$ (0.7) | α: 100% | TiN (0.2) | Granular | Failure after 3.2 min. due to Chipping | Failure after 0.3 min. due to Fracturing |

TABLE 10

| | | Hard Coating Layer | | | | | | | | Flank Wear (mm) | |
|---|---|---|---|---|---|---|---|---|---|---|---|
| | Substrate | Inner Layer | | | Intermediate Layer | | Outer Layer | | Outermost Layer | | |
| | | | | | Second | | | | | Continuous | Interrupted |
| Type | Symbol | Composition | Crystal Structure | Orientation | Composition | Crystal Structure | Composition | Crystal Structure | Composition | Crystal Structure | Cutting | Cutting |
| Coated Cemented Carbide Cutting Tools of | | | | | | | | | | | |

TABLE 10-continued

| | | Hard Coating Layer | | | | | | | | | Flank Wear (mm) | |
|---|---|---|---|---|---|---|---|---|---|---|---|---|
| | Sub-strate | Inner Layer | | | Second Intermediate Layer | | Outer Layer | | Outermost Layer | | | Inter-rupted Cutting |
| Type | Symbol | Composition | Crystal Structure | Orientation | Composition | Crystal Structure | Composition | Crystal Structure | Composition | Crystal Structure | Continuous Cutting | |
| the Invention | | | | | | | | | | | | |
| 43 | A | TiCN (8.4) | Elongated Growth | (111)(220) (200) | TiCNO (0.1) | Granular | Al$_2$O$_3$ (2.0) | κ: 94% | TiN (0.5) | Granular | 0.15 | 0.17 |
| 44 | A | TiCN (5.7) | Elongated Growth | (220)(111) (200) | TiCNO (0.1) | Granular | Al$_2$O$_3$ (6.0) | κ: 85% | | | 0.16 | 0.17 |
| 45 | A | TiCN (11.4) | Elongated Growth | (111)(220) (200) | TiCNO (0.1) | Granular | Al$_2$O$_3$ (1.9) | κ: 100% | TiCN-TiN (0.6) | Granular | 0.15 | 0.19 |
| 46 | B | TiCN (8.2) | Elongated Growth | (111)(200) (220) | TiCNO (0.1) | Granular | Al$_2$O$_3$ (2.1) | κ: 100% | TiN (0.3) | Granular | 0.14 | 0.20 |
| 47 | B | TiCN (5.0) | Elongated Growth | (111)(220) (200) | TiCO (0.2) | Granular | Al$_2$O$_3$ (5.3) | κ: 73% | | | 0.17 | 0.19 |
| 48 | C | TiCN (10.2) | Elongated Growth | (220)(111) (200) | TiCO (0.1) | Granular | Al$_2$O$_3$ (1.2) | κ: 55% | TiN (0.3) | Granular | 0.18 | 0.21 |
| 49 | C | TiCN (5.4) | Elongated Growth | (220)(200) (111) | TiCNO (0.1) | Granular | Al$_2$O$_3$ (0.9) | κ: 62% | TiN (0.4) | Granular | 0.22 | 0.23 |
| 50 | D | TiCN (6.5) | Elongated Growth | (111)(220) (200) | TiCNO (0.1) | Granular | Al$_2$O$_3$ (5.4) | κ: 94% | TiN (0.2) | Granular | 0.13 | 0.18 |
| 51 | D | TiCN (3.8) | Elongated Growth | (220)(111) (200) | TiCNO (0.1) | Granular | Al$_2$O$_3$ (8.2) | κ: 62% | | | 0.12 | 0.21 |
| 52 | D | TiCN (7.7) | Elongated Growth | (111)(220) (200) | TiCNO (0.1) | Granular | Al$_2$O$_3$ (2.4) | κ: 100% | | | 0.14 | 0.19 |
| 53 | E | TiCN (4.1) | Elongated Growth | (220)(111) (200) | TiCNO (0.1) | Granular | Al$_2$O$_3$ (0.6) | κ: 100% | | | 0.14 | (Milling) |
| 54 | E' | TiCN (4.0) | Elongated Growth | (111)(220) (200) | TiCNO (0.1) | Granular | Al$_2$O$_3$ (0.5) | κ: 94% | TiN (0.3) | Granular | 0.16 | (Milling) |
| 55 | F | TiCN (4.4) | Elongated Growth | (220)(111) (200) | TiCO (0.1) | Granular | Al$_2$O$_3$ (0.3) | κ: 100% | TiN (0.3) | Granular | 0.12 | 0.18 |
| 56 | G | TiCN (3.0) | Elongated Growth | (111)(220) (200) | TiCNO (0.2) | Granular | Al$_2$O$_3$ (0.7) | κ: 94% | TiN (0.2) | Granular | 0.13 | 0.17 |

TABLE 11 (a)

| | | Hard Coating Layer | | | | | | | | | Flank Wear (mm) | |
|---|---|---|---|---|---|---|---|---|---|---|---|---|
| | Sub-strate | Inner Layer | | | Second Intermediate Layer | | Outer Layer | | Outermost Layer | | | Inter- |
| Type | Sym-bol | Compo-sition | Crystal Structure | Orientation | Compo-sition | Crystal Structure | Compo-sition | Crystal Structure | Compo-sition | Crystal Structure | Continuous Cutting | rupted Cutting |
| Coated Cemented Carbide Cutting Tools of Prior Art | | | | | | | | | | | | |
| 43 | A | TiCN (8.4) | Granular | (111)(200)(220) | TiCNO (0.1) | Granular | Al$_2$O$_3$ (2.1) | α: 100% | TiN (0.4) | Granular | 0.42 (Chipping) | 0.54 (Chipping) |
| 44 | A | TiCN (5.5) | Granular | (220)(200)(111) | TiCNO (0.1) | Granular | Al$_2$O$_3$ (6.1) | α: 100% | | | 0.47 (Chipping) | 0.51 (Chipping) |
| 45 | A | TiCN (11.5) | Granular | (111)(200)(220) | TiCNO (0.1) | Granular | Al$_2$O$_3$ (1.8) | κ: 40% | TiCN-TiN (0.7) | Granular | 0.43 (Chipping) | 0.55 (Chipping) |
| 46 | B | TiCN (8.3) | Granular | (200)(220)(111) | TiCNO (0.1) | Granular | Al$_2$O$_3$ (2.0) | α: 100% | TiN (0.3) | Granular | Failure after 17.5 min. due to Layer Separation | Failure after 11.1 min. due to Layer Separation |
| 47 | B | TiCN (4.8) | Granular | (111)(200)(220) | TiCO (0.2) | Granular | Al$_2$O$_3$ (5.2) | α: 100% | | | Failure after 14.0 min. due to Layer Separation | Failure after 7.8 min. due to Layer Separation |
| 48 | C | TiCN (10.3) | Granular | (220)(200)(111) | TiCO (0.1) | Granular | Al$_2$O$_3$ (1.3) | α: 100% | TiN (0.2) | Granular | Failure after 8.2 min. due to Layer Separation | Failure after 1.2 min. due to Layer Fracturing |
| 49 | C | TiCN (5.2) | Granular | (200)(220)(111) | TiCNO (0.1) | Granular | Al$_2$O$_3$ (0.9) | κ: 40% | TiN (0.5) | Granular | Failure after 13.6 min. due to Layer Separation | Failure after 5.3 min. due to Layer Fracturing |
| 50 | D | TiCN (6.6) | Granular | (111)(200)(220) | TiCNO (0.1) | Granular | Al$_2$O$_3$ (5.5) | α: 100% | TiN (0.3) | Granular | Failure after 20.7 min. due to Chipping | Failure after 11.4 min. due to Chipping |
| 51 | D | TiCN (3.7) | Granular | (220)(200)(111) | TiCNO (0.1) | Granular | Al$_2$O$_3$ (8.1) | κ: 40% | | | Failure after 18.9 min. due to Chipping | Failure after 8.5 min. due to Chipping |
| 52 | D | TiCN (7.8) | Granular | (111)(200)(220) | TiCNO (0.1) | Granular | Al$_2$O$_3$ (2.3) | α: 100% | | | Failure after 16.3 min. due to Chipping | Failure after 10.1 min. due to Chipping |

TABLE 11 (b)

| | | Hard Coating Layer | | | | | | | | | Flank Wear (mm) | |
|---|---|---|---|---|---|---|---|---|---|---|---|---|
| | Sub-strate | Inner Layer | | | Second Intermediate Layer | | Outer Layer | | Outermost Layer | | | Inter- |
| Type | Symbol | Composition | Crystal Structure | Orientation | Composition | Crystal Structure | Composition | Crystal Structure | Composition | Crystal Structure | Continuous Cutting | rupted Cutting |
| Coated Cemented Carbide Cutting Tools of Prior Art | | | | | | | | | | | | |
| 53 | E | TiCN (4.2) | Granular | (220)(200) (111) | TiCNO (0.1) | Granular | Al$_2$O$_3$ (0.5) | α: 100% | | | Failure after 26.9 min. due to Chipping (Milling) | |
| 54 | E' | TiCN (4.0) | Granular | (111)(200) (220) | TiCNO (0.1) | Granular | Al$_2$O$_3$ (0.4) | α: 100% | TiN (0.2) | Granular | Failure after 24.2 min. due to Layer Separation (Milling) | |
| 55 | F | TiCN (4.5) | Granular | (220)(200) (111) | TiCO (0.1) | Granular | Al$_2$O$_3$ (0.3) | α: 100% | TiN (0.4) | Granular | Failure after 2.0 min. due to Chipping Fracturing | Failure after 2.0 min. due to |
| 56 | G | TiCN (3.2) | Granular | (111)(200) (220) | TiCNO (0.2) | Granular | Al$_2$O$_3$ (0.8) | α: 100% | TiN (0.2) | Granular | Failure after 5.2 min. due to Chipping Fracturing | Failure after 0.7 min. due to |

TABLE 12

| | | Hard Coating Layer | | | | | | | | | | | Flank Wear (mm) | |
|---|---|---|---|---|---|---|---|---|---|---|---|---|---|---|
| | Sub-strate | Innermost Layer | | Inner Layer | | | First Intermediate Layer | | Outer Layer | | Outermost Layer | | | |
| | | | Crystal | | | | | Crystal | | Crystal | | Crystal | Conti- | Inter- |
| Type | Symbol | Composition | Structure | Composition | Crystal Structure | Orientation | Composition | Structure | Composition | Structure | Composition | Structure | nuous Cutting | rupted Cutting |
| Coated Cemented Carbide Cutting Tools of the Invention | | | | | | | | | | | | | | |
| 57 | A | TiN (1.0) | Granular | TiCN (8.5) | Elongated Growth | (111)(220) (200) | TiCNO (0.1) | Granular | Al$_2$O$_3$ (2.2) | κ: 94% | TiN (0.5) | Granular | 0.13 | 0.14 |
| 58 | A | TiN (0.5) | Granular | TiCN (5.6) | Elongated Growth | (220)(111) (200) | TiCNO (0.1) | Granular | Al$_2$O$_3$ (6.0) | κ: 85% | | | 0.15 | 0.13 |
| 59 | A | TiCN (0.8) | Granular | TiCN (11.5) | Elongated Growth | (111)(220) (200) | TiCNO (0.1) | Granular | Al$_2$O$_3$ (1.8) | κ: 100% | TiCN-TiN (0.7) | Granular | 0.14 | 0.15 |
| 60 | B | TiC-TiN (1.4) | Granular | TiCN (8.2) | Elongated Growth | (111)(200) (220) | TiCNO (0.1) | Granular | Al$_2$O$_3$ (2.0) | κ: 100% | TiN (0.3) | Granular | 0.13 | 0.16 |
| 61 | B | TiN (1.6) | Granular | TiCN (4.9) | Elongated Growth | (111)(220) (200) | TiCO (0.2) | Granular | Al$_2$O$_3$ (5.1) | κ: 73% | | | 0.16 | 0.17 |

TABLE 12-continued

| | | Hard Coating Layer | | | | | | | | | | |
|---|---|---|---|---|---|---|---|---|---|---|---|---|
| | | Innermost Layer | | Inner Layer | | | First Intermediate Layer | | Outer Layer | | Outermost Layer | | Flank Wear (mm) | |
| Type | Substrate Symbol | Composition | Crystal Structure | Composition | Crystal Structure | Orientation | Composition | Crystal Structure | Composition | Crystal Structure | Composition | Crystal Structure | Continuous Cutting | Interrupted Cutting |
| 62 | C | TiN (0.1) | Granular | TiCN (10.1) | Elongated Growth | (220)(111) (200) | TiCO (0.1) | Granular | Al$_2$O$_3$ (1.1) | κ: 55% | TiN (0.3) | Granular | 0.17 | 0.19 |
| 63 | C | TiC (0.5) | Granular | TiCN (5.3) | Elongated Growth | (220)(200) (111) | TiCNO (0.1) | Granular | Al$_2$O$_3$ (0.9) | κ: 62% | TiN (0.5) | Granular | 0.20 | 0.21 |
| 64 | D | TiN (0.6) | Granular | TiCN (6.4) | Elongated Growth | (111)(220) (200) | TiCNO (0.1) | Granular | Al$_2$O$_3$ (5.6) | κ: 94% | TiN (0.2) | Granular | 0.12 | 0.15 |
| 65 | D | TiN (1.2) | Granular | TiCN (3.8) | Elongated Growth | (220)(111) (200) | TiCNO (0.1) | Granular | Al$_2$O$_3$ (8.3) | κ: 62% | | | 0.11 | 0.17 |
| 66 | D | TiCN (0.4) | Granular | TiCN (7.8) | Elongated Growth | (111)(220) (200) | TiCNO (0.1) | Granular | Al$_2$O$_3$ (2.5) | κ: 100% | | | 0.13 | 0.15 |
| 67 | E | TiN (0.3) | Granular | TiCN (4.2) | Elongated Growth | (220)(111) (200) | TiCNO (0.1) | Granular | Al$_2$O$_3$ (0.6) | κ: 100% | | | 0.12 | (Milling) |
| 68 | E' | TiN (0.3) | Granular | TiCN (4.1) | Elongated Growth | (111)(220) (200) | TiCNO (0.1) | Granular | Al$_2$O$_3$ (0.4) | κ: 94% | TiN (0.3) | Granular | 0.14 | (Milling) |
| 69 | F | TiN (0.7) | Granular | TiCN (4.6) | Elongated Growth | (220)(111) (200) | TiCO (0.1) | Granular | Al$_2$O$_3$ (0.3) | κ: 100% | TiN (0.5) | Granular | 0.11 | 0.16 |
| 70 | G | TiN-TiCN (1.0) | Granular | TiCN (3.1) | Elongated Growth | (111)(220) (200) | TiCNO (0.2) | Granular | Al$_2$O$_3$ (0.8) | κ: 94% | TiN (0.2) | Granular | 0.11 | 0.15 |

TABLE 13 (a)

| | | Hard Coating Layer | | | | | | | | | | | Flank Wear (mm) | |
|---|---|---|---|---|---|---|---|---|---|---|---|---|---|---|
| | Sub-strate | Innermost Layer | | Inner Layer | | First Intermediate Layer | | Outer Layer | | Outermost Layer | | | |
| Type | Symbol | Composition | Crystal Structure | Composition | Crystal Structure | Orientation | Composition | Crystal Structure | Composition | Crystal Structure | Composition | Crystal Structure | Continuous Cutting | Interrupted Cutting |
| Coated Cemented Carbide Cutting Tools of the Prior Art | | | | | | | | | | | | | | |
| 57 | A | TiN (1.0) | Granular | TiCN (8.4) | Granular | (111)(200)(220) | TiCNO (0.1) | Granular | Al$_2$O$_3$ (2.1) | α: 100% | TiN (0.5) | Granular | 0.38 (Chipping) | 0.51 (Chipping) |
| 58 | A | TiN (0.6) | Granular | TiCN (5.3) | Granular | (220)(200)(111) | TiCNO (0.1) | Granular | Al$_2$O$_3$ (5.9) | α: 100% | | | 0.41 (Chipping) | 0.49 (Chipping) |
| 59 | A | TiCN (0.7) | Granular | TiCN (11.3) | Granular | (111)(200)(220) | TiCNO (0.1) | Granular | Al$_2$O$_3$ (1.7) | κ: 40% | TiCN-TiN (0.6) | Granular | 0.40 (Chipping) | 0.54 (Chipping) |
| 60 | B | TiC-TiN (1.5) | Granular | TiCN (8.1) | Granular | (200)(220)(111) | TiCNO (0.1) | Granular | Al$_2$O$_3$ (2.2) | α: 100% | TiN (0.3) | Granular | Failure after 18.8 min. due to Layer Separation | Failure after 12.3 min. due to Layer Separation |
| 61 | B | TiN (1.6) | Granular | TiCN (4.8) | Granular | (111)(200)(220) | TiCO (0.2) | Granular | Al$_2$O$_3$ (5.0) | α: 100% | | | Failure after 15.1 min. due to Layer Separation | Failure after 8.6 min. due to Layer Separation |
| 62 | C | TiN (0.1) | Granular | TiCN (10.2) | Granular | (220)(200)(111) | TiCO (0.1) | Granular | Al$_2$O$_3$ (5.0) | α: 100% | TiN (0.3) | Granular | Failure after 9.0 min. due to Layer Separation | Failure after 1.7 min. due to Fracturing |
| 63 | C | TiC (0.4) | Granular | TiCN (5.4) | Granular | (200)(220)(111) | TiCNO (0.1) | Granular | Al$_2$O$_3$ (1.0) | κ: 40% | TiN (0.6) | Granular | Failure after 14.6 min. due to Layer Separation | Failure after 5.9 min. due to Fracturing |
| 64 | D | TiN (0.5) | Granular | TiCN (6.6) | Granular | (111)(200)(220) | TiCNO (0.1) | Granular | Al$_2$O$_3$ (5.3) | α: 100% | | | Failure after 21.4 min. due to Chipping | Failure after 12.3 min. due to Chipping |
| 65 | D | TiN (1.3) | Granular | TiCN (3.9) | Granular | (220)(200)(111) | TiCNO (0.1) | Granular | Al$_2$O$_3$ (8.2) | κ: 40% | | | Failure after 19.5 min. due to Chipping | Failure after 9.3 min. due to Chipping |
| 66 | D | TiCN (0.5) | Granular | TiCN (7.7) | Granular | (111)(200)(220) | TiCNO (0.1) | Granular | Al$_2$O$_3$ (2.3) | α: 100% | | | Failure after 17.1 min. due to Chip- | Failure after 10.8 min. due to Chip- |

TABLE 13 (a)-continued

| Type | Substrate Symbol | Innermost Layer Composition | Innermost Layer Crystal Structure | Inner Layer Composition | Inner Layer Crystal Structure | Inner Layer Orientation | First Intermediate Layer Composition | First Intermediate Layer Crystal Structure | Outer Layer Composition | Outer Layer Crystal Structure | Outermost Layer Composition | Outermost Layer Crystal Structure | Flank Wear (mm) Continuous Cutting | Flank Wear (mm) Interrupted Cutting |
|---|---|---|---|---|---|---|---|---|---|---|---|---|---|---|
| | | | | | | | | | | | | | ping | ping |

TABLE 13 (b)

| Type | Substrate Symbol | Innermost Layer Composition | Innermost Layer Crystal Structure | Inner Layer Composition | Inner Layer Crystal Structure | Inner Layer Orientation | Second Intermediate Layer Composition | Second Intermediate Layer Crystal Structure |
|---|---|---|---|---|---|---|---|---|
| Coated Cemented Carbide Cutting Tools of Prior Art | 67 | E | TiN (0.3) | Granular | TiCN (4.0) | Granular | (220) (200) (111) | TiCNO (0.1) | Granular |
| | 68 | E' | TiN (0.3) | Granular | TiCN (3.9) | Granular | (111) (200) (220) | TiCNO (0.1) | Granular |
| | 69 | F | TiN (0.7) | Granular | TiCN (4.5) | Granular | (220) (200) (111) | TiCO (0.1) | Granular |
| | 70 | G | TiN-TiCN (1.0) | Granular | TiCN (3.3) | Granular | (111) (200) (220) | TiCNO (0.2) | Granular |

| Type | Substrate Symbol | Outer Layer Composition | Outer Layer Crystal Structure | Outermost Layer Composition | Outermost Layer Crystal Structure | Flank Wear (mm) Continuous Cutting | Flank Wear (mm) Interrupted Cutting |
|---|---|---|---|---|---|---|---|
| Coated Cemented Carbide Cutting Tools of Prior Art | 67 | E | $Al_2O_3$ (0.6) | α: 100% | | | Failure after 28.0 min. due to Chipping (Milling) | |
| | 68 | E' | $Al_2O_3$ (0.4) | α: 100% | TiN (0.3) | Granular | Failure after 24.8 min. due to Layer Separation (Milling) | |
| | 69 | F | $Al_2O_3$ (0.4) | α: 100% | TiN (0.4) | Granular | Failure after 2.5 min. due to Chipping | Failure after 0.2 min. due to Chipping |
| | 70 | G | $Al_2O_3$ (0.9) | α: 100% | TiN (0.2) | Granular | Failure after 5.7 min. due to Chipping | Failure after 0.9 min. due to Fracturing |

TABLE 14

| Type | Substrate Symbol | Inner Layer Composition | Inner Layer Crystal Structure | Inner Layer Orientation | First Intermediate Layer Composition | First Intermediate Layer Crystal Structure | Second Intermediate Layer Composition | Second Intermediate Layer Crystal Structure |
|---|---|---|---|---|---|---|---|---|
| Coated Cemented Carbide Cutting Tools of the Invention | 71 | A | TiCN (6.3) | Elongated Growth | (111) (220) (200) | TiC (3.2) | Granular | TiCNO (0.1) | Granular |
| | 72 | A | TiCN (3.1) | Elongated Growth | (220) (111) (200) | TiC (2.0) | Granular | TiCNO (0.1) | Granular |
| | 73 | A | TiCN (9.4) | Elongated Growth | (111) (220) (200) | TiC (2.0) | Granular | TiCNO (0.1) | Granular |
| | 74 | B | TiCN (4.6) | Elongated Growth | (111) (200) (220) | TiC (3.8) | Granular | TiCNO (0.1) | Granular |
| | 75 | B | TiCN (4.8) | Elongated Growth | (111) (220) (200) | TiC (1.4) | Granular | TiCO (0.1) | Granular |
| | 76 | C | TiCN (6.6) | Elongated Growth | (220) (111) (201) | TiC (3.1) | Granular | TiCO (0.2) | Granular |
| | 77 | C | TiCN (3.3) | Elongated Growth | (220) (200) (111) | TiN (1.9) | Granular | TiCNO (0.1) | Granular |
| | 78 | D | TiCN (3.5) | Elongated Growth | (111) (220) (200) | TiC (2.9) | Granular | TiCNO (0.1) | Granular |
| | 79 | D | TiCN (2.4) | Elongated Growth | (220) (111) (200) | TiCN (0.6) | Granular | TiCNO (0.1) | Granular |
| | 80 | D | TiCN (5.5) | Elongated Growth | (111) (220) (200) | TiC (2.6) | Granular | TiCNO (0.1) | Granular |
| | 81 | E | TiCN (2.6) | Elongated Growth | (220) (111) (200) | TiC (1.3) | Granular | TiCNO (0.1) | Granular |
| | 82 | E' | TiCN (2.3) | Elongated Growth | (111) (220) (200) | TiC (1.5) | Granular | TiCNO (0.1) | Granular |
| | 83 | F | TiCN (3.4) | Elongated Growth | (220) (111) (200) | TiCN (1.2) | Granular | TiCO (0.1) | Granular |
| | 84 | G | TiCN (1.9) | Elongated Growth | (111) (220) (200) | TiC (1.0) | Granular | TiCNO (0.2) | Granular |

| Type | Substrate Symbol | Outer Layer Composition | Outer Layer Crystal Structure | Outermost Layer Composition | Outermost Layer Crystal Structure | Flank Wear (mm) Continuous Cutting | Flank Wear (mm) Interrupted Cutting |
|---|---|---|---|---|---|---|---|
| Coated Cemented Carbide Cutting Tools of the Invention | 71 | A | $Al_2O_3$ (2.3) | κ: 94% | TiN (0.2) | Granular | 0.16 | 0.20 |
| | 72 | A | $Al_2O_3$ (6.0) | κ: 85% | | | 0.19 | 0.19 |
| | 73 | A | $Al_2O_3$ (2.1) | κ: 100% | TiCN—TiN (0.7) | Granular | 0.16 | 0.21 |
| | 74 | B | $Al_2O_3$ (2.0) | κ: 100% | TiN (0.3) | Granular | 0.15 | 0.23 |
| | 75 | B | $Al_2O_3$ (3.8) | κ: 73% | | | 0.19 | 0.21 |
| | 76 | C | $Al_2O_3$ (1.0) | κ: 55% | TiN (0.3) | Granular | 0.20 | 0.24 |
| | 77 | C | $Al_2O_3$ (0.8) | κ: 62% | TiN (0.5) | Granular | 0.25 | 0.25 |
| | 78 | D | $Al_2O_3$ (5.2) | κ: 73% | TiN (0.5) | Granular | 0.15 | 0.19 |
| | 79 | D | $Al_2O_3$ (8.0) | κ: 62% | | | 0.14 | 0.22 |
| | 80 | D | $Al_2O_3$ (2.7) | κ: 100% | | | 0.15 | 0.21 |
| | 81 | E | $Al_2O_3$ (0.5) | κ: 100% | | | 0.15 (Milling) | |
| | 82 | E' | $Al_2O_3$ (0.4) | κ: 94% | TiN (0.2) | Granular | 0.17 (Milling) | |
| | 83 | F | $Al_2O_3$ (0.4) | κ: 100% | TiN (0.3) | Granular | 0.14 | 0.20 |
| | 84 | G | $Al_2O_3$ (0.8) | κ: 94% | TiN (0.3) | Granular | 0.13 | 0.19 |

TABLE 15(a)

| Type | Substrate Symbol | Inner Layer Composition | Inner Layer Crystal Structure | Inner Layer Orientation | First Intermediate Layer Composition | First Intermediate Layer Crystal Structure | Second Intermediate Layer Composition | Second Intermediate Layer Crystal Structure | Outer Layer Composition | Outer Layer Crystal Structure | Outermost Layer Composition | Outermost Layer Crystal Structure | Flank Wear (mm) Continuous Cutting | Flank Wear (mm) Interrupted Cutting |
|---|---|---|---|---|---|---|---|---|---|---|---|---|---|---|
| Coated Cemented Carbide Cutting Tools of Prior Art | 71 | A | TiCN (6.2) | Granular | (111) (200) (220) | TiC (3.2) | Granular | TiCNO (0.1) | Granular | Al₂O₃ (2.5) | α: 100% | TiN (0.3) | Granular | 0.43 (Chipping) | 0.53 (Chipping) |
| | 72 | A | TiCN (3.0) | Granular | (220) (200) (111) | TiC (2.0) | Granular | TiCNO (0.1) | Granular | Al₂O₃ (5.9) | α: 100% | | | 0.49 (Chipping) | 0.52 (Chipping) |
| | 73 | A | TiCN (9.3) | Granular | (111) (200) (220) | TiC (2.1) | Granular | TiCNO (0.1) | Granular | Al₂O₃ (2.2) | κ: 40% | TiCN—TiN (0.6) | Granular | 0.37 (Chipping) | 0.40 (Chipping) |
| | 74 | B | TiCN (4.7) | Granular | (200) (220) (111) | TiC (3.7) | Granular | TiCNO (0.1) | Granular | Al₂O₃ (1.9) | α: 100% | TiN (0.2) | Granular | Failure after 14.7 min. due to Layer Separation | Failure after 9.5 min. due to Layer Separation |
| | 75 | B | TiCN (4.8) | Granular | (111) (200) (220) | TiC (1.2) | Granular | TiCO (0.1) | Granular | Al₂O₃ (3.7) | α: 100% | | | Failure after 12.1 min. due to Layer Separation | Failure after 6.3 min. due to Layer Separation |
| | 76 | C | TiCN (6.7) | Granular | (220) (200) (111) | TiC (2.9) | Granular | TiCO (0.2) | Granular | Al₂O₃ (1.2) | α: 100% | TiN (0.4) | Granular | Failure after 6.8 min. due to Layer Separation | Failure after 1.2 min. due to Fracturing |
| | 77 | C | TiCN (3.2) | Granular | (200) (220) (111) | TiN (1.8) | Granular | TiCNO (0.1) | Granular | Al₂O₃ (0.8) | κ: 40% | TiN (0.4) | Granular | Failure after 11.9 min. due to Layer Separation | Failure after 4.4 min. due to Fracturing |
| | 78 | D | TiCN (3.4) | Granular | (111) (200) (220) | TiC (2.8) | Granular | TiCNO (0.1) | Granular | Al₂O₃ (5.1) | α: 100% | TiN (0.3) | Granular | Failure after 18.6 min. due to Chipping | Failure after 9.5 min. due to Chipping |
| | 79 | D | TiCN (2.4) | Granular | (220) (200) (111) | TiCN (1.3) | Granular | TiCNO (0.1) | Granular | Al₂O₃ (8.1) | κ: 40% | | | Failure after 17.0 min. due to Chipping | Failure after 6.8 min. due to Chipping |
| | 80 | D | TiCN (5.3) | Granular | (111) (200) (220) | TiC (2.5) | Granular | TiCNO (0.1) | Granular | Al₂O₃ (2.6) | α: 100% | | | Failure after 15.9 min. due to Chipping | Failure after 8.4 min. due to Chipping |

TABLE 15(b)

| Type | Substrate Symbol | Hard Coating Layer | | | | | | | |
|---|---|---|---|---|---|---|---|---|---|
| | | Inner Layer | | | First Intermediate Layer | | Second Intermediate Layer | |
| | | Composition | Crystal Structure | Orientation | Composition | Crystal Structure | Composition | Crystal Structure |
| Coated Cemented Carbide Cutting Tools of Prior Art | 81 | E | TiCN (2.4) | Granular | (220) (200) (111) | TiC (1.5) | Granular (Milling) | TiCNO (0.1) | Granular |
| | 82 | E' | TiCN (2.5) | Granular | (111) (200) (220) | TiC (1.4) | Granular | TiCNO (0.1) | Granular |
| | 83 | F | TiCN (3.3) | Granular | (220) (200) (111) | TiCN (1.3) | Granular | TiCO (0.1) | Granular |
| | 84 | G | TiCN (1.8) | Granular | (111) (200) (220) | TiC (1.0) | Granular | TiCNO (0.2) | Granular |

| Type | Substrate Symbol | Hard Coating Layer | | | | Flank Wear (mm) | |
|---|---|---|---|---|---|---|---|
| | | Outer Layer | | Outermost Layer | | | |
| | | Composition | Crystal Structure | Composition | Crystal Structure | Continuous Cutting | Interrupted Cutting |
| Coated Cemented Carbide Cutting Tools of Prior Art | 81 | E | Al$_2$O$_3$ (0.4) | α: 100% | | | Failure after 23.2 min. due to Chipping | |
| | 82 | E' | Al$_2$O$_3$ (0.4) | α: 100% | TiN (0.2) | Granular | Failure after 20.1 min. due to Layer Separation (Milling) | |
| | 83 | F | Al$_2$O$_3$ (0.3) | α: 100% | TiN (0.2) | Granular | Failure after 1.6 min. due to Chipping | Failure after 0.1 min. due to Fracturing |
| | 84 | G | Al$_2$O$_3$ (0.7) | α: 100% | TiN (0.3) | Granular | Failure after 3.5 min. due to Chipping | Failure after 0.3 min. due to Fracturing |

TABLE 16

| Type | Sub-strate Symbol | Innermost Layer Composition | Innermost Layer Crystal Structure | Inner Layer Composition | Inner Layer Crystal Structure | Inner Layer Orientation | First Intermediate Layer Composition | First Intermediate Layer Crystal Structure | Second Intermediate Layer Composition | Second Intermediate Layer Crystal Structure |
|---|---|---|---|---|---|---|---|---|---|---|
| Coated Cemented Carbide Cutting Tools of the Invention | 85 | A | TiN (0.8) | Granular | TiCN (6.4) | Elongated Growth | (111) (220) (200) | TiC (3.0) | Granular | TiCNO (0.1) | Granular |
| | 87 | A | TiCN (0.7) | Granular | TiCN (9.2) | Elongated Growth | (111) (220) (200) | TiC (2.1) | Granular | TiCNO (0.1) | Granular |
| | 88 | B | TiC—TiN (1.2) | Granular | TiCN (4.7) | Elongated Growth | (111) (200) (220) | TiC (3.8) | Granular | TiCNO (0.1) | Granular |
| | 89 | B | TiN (1.5) | Granular | TiCN (4.8) | Elongated Growth | (111) (220) (200) | TiC (1.2) | Granular | TiCO (0.1) | Granular |
| | 90 | C | TiN (0.1) | Granular | TiCN (6.7) | Elonaged Growth | (220) (111) (200) | TiC (3.0) | Granular | TiCO (0.2) | Granular |
| | 91 | C | TiC (0.7) | Granular | TiCN (3.2) | Elongated Growth | (220) (200) (111) | TiN (1.7) | Granular | TiCNO (0.1) | Granular |
| | 92 | D | TiN (0.6) | Granular | TiCN (3.6) | Elongated Growth | (111) (220) (200) | TiC (2.8) | Granular | TiCNO (0.1) | Granular |
| | 93 | D | TiN (1.0) | Granular | TiCN (2.3) | Elongated Growth | (220) (111) (200) | TiCN (1.2) | Granular | TiCNO (0.1) | Granular |
| | 94 | D | TiCN (0.4) | Granular | TiCN (5.4) | Elongated Growth | (111) (220) (200) | TiC (2.5) | Granular | TiCNO (0.1) | Granular |
| | 95 | E | TiN (0.3) | Granular | TiCN (.26) | Elongated Growth | (220) (111) (200) | TiC (1.4) | Granular | TiCNO (0.1) | Granular |
| | 96 | E' | TiN (0.3) | Granular | TiCN (2.5) | Elongated Growth | (111) (220) (200) | TiC (1.5) | Granular | TiCNO (0.1) | Granular |
| | 97 | F | TiN (0.5) | Granular | TiCN (3.2) | Elongated Growth | (220) (111) (200) | TiCN (1.4) | Granular | TiCO (0.1) | Granular |
| | 98 | G | TiN—TiCN (1.1) | Granular | TiCN (1.9) | Elongated Growth | (111) (220) (200) | TiC (1.0) | Granular | TiCNO (0.2) | Granular |

| Type | Sub-strate Symbol | Outer Layer Composition | Outer Layer Crystal Structure | Outermost Layer Composition | Outermost Layer Crystal Structure | Flank Wear (mm) Continuous Cutting | Flank Wear (mm) Interrupted Cutting |
|---|---|---|---|---|---|---|---|
| Coated Cemented Carbide Cutting Tools of the Invention | 85 | A | Al$_2$O$_3$ (2.5) | κ: 94% | TiN (0.2) | Granular | 0.15 | 0.19 |
| | 86 | A | Al$_2$O$_3$ (5.9) | κ: 85% | | | 0.17 | 0.18 |
| | 87 | A | Al$_2$O$_3$ (2.0) | κ: 100% | TiCN—TiN (0.6) | Granular | 0.15 | 0.20 |
| | 88 | B | Al$_2$O$_3$ (1.9) | κ: 100% | TiN (0.2) | Granular | 0.14 | 0.22 |
| | 89 | B | Al$_2$O$_3$ (3.9) | κ: 73% | | | 0.18 | 0.19 |
| | 90 | C | Al$_2$O$_3$ (1.1) | κ: 55% | TiN (0.3) | Granular | 0.18 | 0.23 |
| | 91 | C | Al$_2$O$_3$ (0.8) | κ: 62% | TiN (0.5) | Granular | 0.23 | 0.24 |
| | 92 | D | Al$_2$O$_3$ (5.1) | κ: 73% | | | 0.13 | 0.19 |
| | 93 | D | Al$_2$O$_3$ (8.1) | κ: 62% | | | 0.13 | 0.21 |
| | 94 | D | Al$_2$O$_3$ (2.8) | κ: 100% | | | 0.14 | 0.20 |
| | 95 | E | Al$_2$O$_3$ (0.5) | κ: 100% | | | 0.14 (Milling) | |
| | 96 | E' | Al$_2$O$_3$ (0.3) | κ: 94% | TiN (0.2) | Granular | 0.16 (Milling) | |
| | 97 | F | Al$_2$O$_3$ (0.3) | κ: 100% | TiN (0.3) | Granular | 0.13 | 0.19 |
| | 98 | G | Al$_2$O$_3$ (0.7) | κ: 94% | TiN (0.2) | Granular | 0.13 | 0.18 |

TABLE 17

| Type | Sub-strate Symbol | Innermost Layer Composition | Innermost Layer Crystal Structure | Inner Layer Composition | Inner Layer Crystal Structure | Inner Layer Orientation | First Intermediate Layer Composition | First Intermediate Layer Crystal Structure | Second Intermediate Layer Composition | Second Intermediate Layer Crystal Structure | Outer Layer Composition | Outer Layer Crystal Structure | Outermost Layer Composition | Outermost Layer Crystal Structure | Flank Wear (mm) Continuous Cutting | Flank Wear (mm) Interrupted Cutting |
|---|---|---|---|---|---|---|---|---|---|---|---|---|---|---|---|---|
| Coated Cemented Carbide Cutting Tools of Prior Art | 85 | A | TiN (0.9) | Granular | TiCN (6.0) | Granular | (111) (200) (220) | TiC (3.3) | Granular | TiCNO (0.1) | Granular | Al₂O₃ (2.4) | α: 100% | TiN (0.2) | Granular | 0.41 (Chipping) | 0.52 (Chipping) |
| | 86 | A | TiN (0.4) | Granular | TiCN (3.2) | Granular | (220) (200) (111) | TiC (2.0) | Granular | TiCNO (0.1) | Granular | Al₂O₃ (5.8) | α: 100% | | | 0.48 (Chipping) | 0.50 (Chipping) |
| | 87 | A | TiCN (0.5) | Granular | TiCN (9.3) | Granular | (111) (200) (220) | TiC (2.2) | Granular | TiCNO (0.1) | Granular | Al₂O₃ (2.2) | κ: 40% | TiCN—TiN (0.7) | Granular | 0.35 (Chipping) | 0.39 (Chipping) |
| | 88 | B | TiC—TiN (1.3) | Granular | TiCN (4.6) | Granular | (200) (220) (111) | TiC (3.9) | Granular | TiCNO (0.1) | Granular | Al₂O₃ (1.8) | α: 100% | TiN (0.2) | Granular | Failure after 15.1 min. due to Layer Separation | Failure after 9.8 min. due to Layer Separation |
| | 89 | B | TiN (1.6) | Granular | TiCN (4.7) | Granular | (111) (200) (220) | TiC (1.3) | Granular | TiCO (0.1) | Granular | Al₂O₃ (3.8) | α: 100% | | | Failure after 12.6 min. due to Layer Separation | Failure after 6.8 min. due to Layer Separation |
| | 90 | C | TiN (0.1) | Granular | TiCN (6.5) | Granular | (220) (200) (111) | TiC (3.0) | Granular | TiCO (0.2) | Granular | Al₂O₃ (1.1) | α: 100% | TiN (0.3) | Granular | Failure after 7.1 min. due to Layer Separation | Failure after 1.5 min. due to Fracturing |
| | 91 | C | TiC (0.8) | Granular | TiCN (3.1) | Granular | (200) (220) (111) | TiN (1.8) | Granular | TiCNO (0.1) | Granular | Al₂O₃ (0.9) | κ: 40% | TiN (0.4) | Granular | Failure after 12.5 min. due to Layer Separation | Failure after 4.7 min. due to Fracturing |
| | 92 | D | TiN (0.5) | Granular | TiCN (3.4) | Granular | (111) (200) (220) | TiC (2.9) | Granular | TiCNO (0.1) | Granular | Al₂O₃ (5.0) | α: 100% | | | Failure after 19.2 min. due to Chipping | Failure after 9.8 min. due to Chipping |
| | 93 | D | TiN (0.9) | Granular | TiCN (2.5) | Granular | (220) (200) (111) | TiCN (1.3) | Granular | TiCNO (0.1) | Granular | | | | | | |
| | 94 | D | TiCN (0.5) | Granular | TiCN (5.5) | Granular | (111) (200) (220) | TiC (2.4) | Granular | TiCNO (0.1) | Granular | | | | | | |
| | 95 | E | TiN (0.3) | Granular | TiCN (2.5) | Granular | (220) (200) (111) | TiC (1.4) | Granular | TiCNO (0.1) | Granular | | | | | | |
| | 96 | E | TiN (0.3) | Granular | TiCN (2.4) | Granular | (111) (200) (220) | TiC (1.5) | Granular | TiCNO (0.1) | Granular | | | | | | |
| | 97 | F | TiN (0.4) | Granular | TiCN (3.3) | Granular | (220) (200) (111) | TiCN (1.3) | Granular | TiCO (0.1) | Granular | | | | | | |
| | 98 | G | TiN—TiCN (1.0) | Granular | TiCN (1.8) | Granular | (111) (200) (220) | TiC (1.1) | Granular | TiCNO (0.2) | Granular | | | | | | |

TABLE 17-continued

| | Sub-strate | | Innermost Layer | Inner Layer | | First Intermediate Layer | Second Intermediate Layer |
|---|---|---|---|---|---|---|---|
| | 93 | D | | Al₂O₃ (8.2) | κ: 40% | Failure after 17.6 min. due to Chipping | Failure after 7.2 min. due to Chipping |
| | 94 | D | | Al₂O₃ (2.6) | α: 100% | Failure after 16.3 min. due to Chipping | Failure after 8.7 min. due to Chipping |
| | 95 | E | | Al₂O₃ (0.5) | α: 100% | Failure after 23.7 min. due to Chipping (Milling) | |
| | 96 | E' | | Al₂O₃ (0.3) | α: 100% | TiN (0.2) Granular | Failure after 20.7 min. due to Layer Separation (Milling) |
| | 97 | F | | Al₂O₃ (0.4) | α: 100% | TiN (0.3) Granular | Failure after 1.8 min. due to Chipping | Failure after 0.1 min. due to Fracturing |
| | 98 | G | | Al₂O₃ (0.8) | α: 100% | TiN (0.3) Granular | Failure after 3.9 min. due to Chipping | Failure after 0.4 min. due to Fracturing |

TABLE 18(a)

Hard Coating Layer — Inner Layer

| Type | | Substrate Symbol | Innermost Layer Composition | Innermost Layer Crystal Structure | First Divided Layer Composition | First Divided Layer Crystal Structure | First Dividing Layer Composition | First Dividing Layer Crystal Structure | Second Dividing Layer Composition | Second Dividing Layer Crystal Structure | Second Dividing Layer Composition | Second Dividing Layer Crystal Structure |
|---|---|---|---|---|---|---|---|---|---|---|---|---|
| Coated Cemented Carbide Cutting Tools of the Invention | 99 | A | TiN (1.0) | Granular | TiCN (2.4) | Elongated Growth | TiN (0.3) | Granular | TiCN (2.4) | Elongated Growth | TiN (0.2) | Granular |
| | 100 | A | | | TiCN (3.0) | Elongated Growth | TiN (0.2) | Granular | TiCN (3.0) | Elongated Growth | | |
| | 101 | A | TiN (0.5) | Granular | TiCN (3.2) | Elongated Growth | TiN (0.2) | Granular | TiCN (3.1) | Elongated Growth | | |
| | 102 | A | TiN (0.5) | Granular | TiCN (3.1) | Elongated Growth | TiN (0.2) | Granular | TiCN (3.0) | Elongated Growth | | |
| | 103 | B | | | TiCN (2.7) | Elongated Growth | TiN (0.2) | Granular | TiCN (2.7) | Elongated Growth | TiN (0.2) | Granular |
| | 104 | B | TiC—TiN (1.4) | Granular | TiCN (2.2) | Elongated Growth | TiN (0.3) | Granular | TiCN (2.3) | Elongated Growth | | |
| | 105 | B | TiN (1.6) | Granular | TiCN (3.4) | Elongated Growth | TiN (0.2) | Granular | TiCN (2.6) | Elongated Growth | TiN (0.2) | Granular |
| | 106 | C | | | TiCN (4.7) | Elongated Growth | TiN (0.2) | Granular | TiCN (4.8) | Elongated Growth | | |
| | 107 | C | TiC (0.5) | Granular | TiCN (1.1) | Elongated Growth | TiN (0.1) | Granular | TiCN (0.8) | Elongated Growth | TiN (0.2) | Granular |
| | 108 | C | TiN (0.5) | Granular | TiCN (2.5) | Elongated Growth | TiN (0.3) | Granular | TiCN (2.3) | Elongated Growth | TiN (0.2) | Granular |
| | 109 | D | TiN (0.6) | Granular | TiCN (3.2) | Elongated Growth | TiN (0.3) | Granular | TiCN (3.2) | Elongated Growth | | |
| | 110 | D | TiN (0.8) | Granular | TiCN (1.2) | Elongated Growth | TiN (0.2) | Granular | TiCN (1.0) | Elongated Growth | | |
| | 111 | D | TiCN (0.6) | Granular | TiCN (2.0) | Elongated Growth | TiN (0.3) | Granular | TiCN (1.8) | Elongated Growth | TiN (0.2) | Granular |
| | 112 | D | | | TiCN (3.4) | Elongated Growth | TiN (0.2) | Granular | TiCN (3.5) | Elongated Growth | | |

Hard Coating Layer — Inner Layer

| | Substrate | Third Divided Layer Composition | Third Divided Layer Crystal | Third Dividing Layer Composition | Third Dividing Layer Crystal | Forth Divided Layer Composition | Forth Divided Layer Crystal |
|---|---|---|---|---|---|---|---|

TABLE 18(a)-continued

| Type | | Symbol | | sition | Structure | sition | Structure | sition | Structure |
|---|---|---|---|---|---|---|---|---|---|
| Coated Cemented Carbide Cutting Tools of the Invention | | 99 | A | TiCN (2.4) | Elongated Growth | TiN (0.2) | Granular | TiCN (2.3) | Elongated Growth |
| | | 100 | A | | | | | | |
| | | 101 | A | | | | | | |
| | | 102 | A | | | | | | |
| | | 103 | B | TiCN (2.6) | Elongated Growth | | | | |
| | | 104 | B | | | | | | |
| | | 105 | B | TiCN (2.8) | Elongated Growth | | | | |
| | | 106 | C | | | | | | |
| | | 107 | C | TiCN (1.0) | Elongated Growth | | | | |
| | | 108 | C | TiCN (2.4) | Elongated Growth | | | | |
| | | 109 | D | | | | | | |
| | | 110 | D | | | | | | |
| | | 111 | D | TiCN (1.9) | Elongated Growth | TiN (0.2) | Granular | TiCN (1.7) | Elongated Growth |
| | | 112 | D | | | | | | |

TABLE 18(b)

| | | | | Hard Coating Layer | | | | | | | Flank Wear (mm) | |
|---|---|---|---|---|---|---|---|---|---|---|---|---|
| | | Sub- | | First Intermediate Layer | | Second Intermediate Layer | | Outer Layer | | Outermost Layer | | |
| Type | | strate Symbol | Inner Layer Orientation | Compo-sition | Crystal Structure | Compo-sition | Crystal Structure | Compo-sition | Crystal Structure | Compo-sition | Crystal Structure | High-Feed Cutting | Deep-cut Cutting |
| Coated Cemented Carbide Cutting Tools of the Invention | 99 | A | (111) (220) (200) | | | TiCNO (0.1) | Granular | $Al_2O_3$ (2.5) | κ: 94% | TiN (0.2) | Granular | 0.15 | 0.15 |
| | 100 | A | (220) (111) (200) | TiC (3.0) | Granular | TiCNO (0.1) | Granular | $Al_2O_3$ (2.7) | κ: 100% | TiN (0.2) | Granular | 0.16 | 0.20 |
| | 101 | A | (111) (220) (200) | TiC (1.9) | Granular | | | $Al_2O_3$ (2.0) | κ: 100% | TiCN—TiN (0.6) | Granular | 0.17 | 0.18 |
| | 102 | A | (111) (200) (220) | TiC (3.0) | Granular | | | $Al_2O_3$ (2.7) | κ: 73% | TiN (0.2) | Granular | 0.21 | 0.19 |
| | 103 | B | (111) (220) (200) | | | TiCO (0.1) | Granular | $Al_2O_3$ (3.4) | κ: 100% | | | 0.16 | 0.22 |
| | 104 | B | (111) (200) (220) | TiC (3.8) | Granular | TiCNO (0.1) | Granular | $Al_2O_3$ (1.9) | κ: 73% | TiN (0.2) | Granular | 0.15 | 0.17 |
| | 105 | B | (111) (220) (200) | | | TiCO (0.1) | Granular | $Al_2O_3$ (3.3) | κ: 55% | | | 0.20 | 0.16 |
| | 106 | C | (220) (111) (200) | | | TiCO (0.1) | Granular | $Al_2O_3$ (1.5) | κ: 85% | TiN (0.2) | Granular | 0.20 | 0.21 |
| | 107 | C | (220) (200) (111) | TiN (1.8) | Granular | TiCNO (0.1) | Granular | $Al_2O_3$ (0.8) | κ: 62% | | | 0.24 | 0.20 |
| | 108 | C | (111) (220) (200) | | | | | $Al_2O_3$ (2.6) | κ: 94% | TiN (0.5) | Granular | 0.19 | 0.23 |
| | 109 | D | (111) (220) (200) | | | TiCNO (0.1) | Granular | $Al_2O_3$ (5.2) | κ: 73% | | | 0.15 | 0.17 |
| | 110 | D | (220) (111) (200) | TiCN (1.4) | Granular | | | $Al_2O_3$ (8.1) | κ: 62% | | | 0.15 | 0.22 |
| | 111 | D | (111) (220) (200) | | | | | $Al_2O_3$ (2.8) | κ: 100% | | | 0.16 | 0.19 |
| | 112 | D | (111) (220) (200) | TiC (1.2) | Granular | | | $Al_2O_3$ (4.3) | κ: 73% | TiN (0.2) | Granular | 0.16 | 0.17 |

TABLE 19(a)

| | | | Hard Coating Layer | | | | | | | |
|---|---|---|---|---|---|---|---|---|---|---|
| | | | Innermost Layer | | Inner Layer | | | | | |
| | | Sub- | | | First Devided Layer | | First Dividing Layer | | Second Divided Layer | | Second Dividing Layer | |
| Type | | strate Symbol | Composition | Crystal Structure | Composition | Crystal Structure | Composition | Crystal Structure | Composition | Crystal Structure | Composition | Crystal Structure |
| Coated Cemented Carbide Cutting Tools of the Invention | 113 | F | TiN (0.4) | Granular | TiCN (1.6) | Elongated Growth | TiN (0.2) | Granular | TiCN (1.5) | Elongated Growth | | |
| | 114 | F | TiN—TiCN (1.0) | Granular | TiCN (0.9) | Elongated Growth | TiN (0.1) | Granular | TiCN (1.0) | Elongated Growth | | |
| | 115 | F | | | TiCN (1.9) | Elongated Growth | TiN (0.2) | Granular | TiCN (2.0) | Elongated Growth | TiN (0.3) | Granular |
| | 116 | F | | | TiCN (2.2) | Elongated Growth | TiN (0.3) | Granular | TiCN (2.3) | Elongated Growth | | |
| | 117 | G | TiC—TiN (0.9) | Granular | TiCN (1.1) | Elongated Growth | TiN (0.2) | Granular | TiCN (1.1) | Elongated Growth | TiN (0.1) | Granular |
| | 118 | G | | | TiCN (3.4) | Elongated Growth | TiN (0.2) | Granular | TiCN (3.3) | Elongated Growth | | |
| | 119 | G | TiN (0.5) | Granular | TiCN (1.1) | Elongated Growth | TiN (0.1) | Granular | TiCN (0.8) | Elongated Growth | TiN (0.2) | Granular |
| | 120 | G | | | TiCN (1.7) | Elongated Growth | TiN (0.2) | Granular | TiCN (1.6) | Elongated Growth | | |
| | 121 | G | | | TiCN (2.2) | Elongated Growth | TiN (0.2) | Granular | TiCN (2.0) | Elongated Growth | | |
| | 122 | E | TiCN (0.6) | Granular | TiCN (0.7) | Elongated Growth | TiN (0.2) | Granular | TiCN (0.6) | Elongated Growth | TiN (0.2) | Granular |
| | 123 | E | TiN (0.34) | Granular | TiCN (1.3) | Elongated Growth | TiN (0.1) | Granular | TiCN (1.3) | Elongated Growth | | |
| | 124 | E | TiN (0.3) | Granular | TiCN (1.8) | Elongated Growth | TiN (0.1) | Granular | TiCN (1.7) | Elongated Growth | | |
| | 125 | E' | | | TiCN (1.4) | Elongated Growth | TiN (0.3) | Granular | TiCN (1.3) | Elongated Growth | | |
| | 126 | E' | TiC (0.7) | Granular | TiCN (1.5) | Elongated Growth | TiN (0.2) | Granular | TiCN (1.6) | Elongated Growth | | |

| | | | Hard Coating Layer Inner Layer | | | | | |
|---|---|---|---|---|---|---|---|---|
| | | Sub- | Third Divided Layer | | Third Dividing Layer | | Forth Divided Layer | |
| Type | | strate Symbol | Composition | Crystal Structure | Composition | Crystal Structure | Composition | Crystal Structure |
| Coated Cemented Carbide Cutting Tools of the Invention | 113 | F | | | | | TiCN (2.3) | Elongated Growth |
| | 114 | F | | | | | | |
| | 115 | F | TiCN (1.9) | Elongated Growth | | | | |
| | 116 | F | | | | | | |
| | 117 | G | TiCN (1.0) | Elongated Growth | | | | |
| | 118 | G | | | | | | |
| | 119 | G | TiCN (1.0) | Elongated Growth | | | | |
| | 120 | G | | | | | | |
| | 121 | G | | | | | | |
| | 122 | E | TiCN (0.6) | Elongated Growth | TiN (0.2) | Granular | TiCN (0.7) | Elongated Growth |
| | 123 | E | | | | | | |
| | 124 | E | | | | | | |
| | 125 | E' | | | | | | |
| | 126 | E' | | | | | | |

TABLE 19(b)

| | | Sub-strate Symbol | Inner Layer Orientation | Hard Coating Layer | | | |
|---|---|---|---|---|---|---|---|
| | | | | First Intermediate Layer | | Second Intermediate Layer | |
| Type | | | | Composition | Crystal Structure | Composition | Crystal Structure |
| Coated Cemented Carbide Cutting Tools of the Invention | 113 | F | (220) (111) (200) | TiCN (1.4) | Granular | TiCO (0.1) | Granular |
| | 114 | F | (111) (220) (200) | | | TiCNO (0.2) | Granular |
| | 115 | F | (111) (220) (200) | TiCN (1.1) | Granular | | |
| | 116 | F | (111) (200) (220) | | | | |
| | 117 | G | (111) (220) (200) | | | TiCO (0.1) | Granular |
| | 118 | G | (220) (111) (200) | | | TiCO (0.1) | Granular |
| | 119 | G | (220) (200) (111) | TiN (1.7) | Granular | | |
| | 120 | G | (111) (220) (200) | TiC (2.9) | Granular | TiCNO (0.1) | Granular |
| | 121 | G | (220) (111) (200) | | | | |
| | 122 | E | (111) (220) (200) | | | | |
| | 123 | E | (220) (111) (200) | TiC (1.4) | Granular | TiCNO (0.1) | Granular |
| | 124 | E | (111) (220) (200) | | | TiCNO (0.1) | Granular |
| | 125 | E' | (220) (111) (200) | TiCN (0.8) | Granular | | |
| | 126 | E' | (111) (220) (200) | | | TiCNO (0.2) | Granular |

| | | Sub-strate Symbol | Hard Coating Layer | | | | Flank Wear (mm) | |
|---|---|---|---|---|---|---|---|---|
| | | | Outer Layer | | Outermost Layer | | | |
| Type | | | Composition | Crystal Structure | Composition | Crystal Structure | Continuous Cutting | Interrupted Cutting |
| Coated Cemented Carbide Cutting Tools of the Invention | 113 | F | Al$_2$O$_3$ (0.2) | κ: 100% | TiN (0.2) | Granular | 0.14 | 0.18 |
| | 114 | F | Al$_2$O$_3$ (0.7) | κ: 94% | TiN (0.2) | Granular | 0.12 | 0.19 |
| | 115 | F | Al$_2$O$_3$ (1.5) | κ: 100% | | | 0.13 | 0.25 |
| | 116 | F | Al$_2$O$_3$ (1.2) | κ: 94% | TiN (0.3) | Granular | 0.14 | 0.21 |
| | 117 | G | Al$_2$O$_3$ (0.5) | κ: 55% | | | 0.12 | 0.20 |
| | 118 | G | Al$_2$O$_3$ (2.0) | κ: 94% | TiN (0.4) | Granular | 0.11 | 0.24 |
| | 119 | G | Al$_2$O$_3$ (0.8) | κ: 62% | TiN (0.5) | Granular | 0.15 | 0.20 |
| | 120 | G | Al$_2$O$_3$ (1.2) | κ: 85% | | | 0.14 | 0.19 |
| | 121 | G | Al$_2$O$_3$ (1.0) | κ: 100% | | | 0.12 | 0.23 |
| | 122 | E | Al$_2$O$_3$ (0.8) | κ: 94% | TiN (0.3) | Granular | 0.14 (Milling) | |
| | 123 | E | Al$_2$O$_3$ (0.5) | κ: 100% | | | 0.15 (Milling) | |
| | 124 | E | Al$_2$O$_3$ (0.4) | κ: 100% | TiN (0.2) | Granular | 0.14 (Milling) | |
| | 125 | E' | Al$_2$O$_3$ (0.3) | κ: 100% | | | 0.15 (Milling) | |
| | 126 | E' | Al$_2$O$_3$ (1.1) | κ: 94% | TiN (0.2) | Granular | 0.14 (Milling) | |

TABLE 20

| Type | | Sub-strate Symbol | Hard Coating Layer | | | | | | | | |
|---|---|---|---|---|---|---|---|---|---|---|---|
| | | | Innermost Layer | | Inner Layer | | | First Intermediate Layer | | Second Intermediate Layer | |
| | | | Composition | Crystal Structure | Composition | Crystal Structure | Orientation | Composition | Crystal Structure | Composition | Crystal Structure |
| Coated Cemented Carbide Cutting Tools of Prior Art | 99 | A | TiN (1.0) | Granular | TiCN (9.5) | Granular | (111) (200) (220) | | | TiCNO (0.1) | Granular |
| | 100 | A | | | TiCN (6.1) | Granular | (220) (200) (111) | TiC (2.8) | Granular | TiCNO (0.1) | Granular |
| | 101 | A | TiN (0.6) | Granular | TiCN (9.3) | Granular | (111) (200) (220) | TiC (2.0) | Granular | | |
| | 102 | A | TiN (0.5) | Granular | TiCN (6.0) | Granular | (200) (220) (111) | TiC (3.0) | Granular | | |
| | 103 | B | | | TiCN (8.4) | Granular | (111) (200) (220) | | | TiCO (0.1) | Granular |
| | 104 | B | TiC—TiN (1.5) | Granular (6.6) | TiCN | Granular | (220) (200) (111) (3.6) | TiC | Granular (0.1) | TiCNO | Granular |
| | 105 | B | TiN (1.7) | Granular | TiCN (8.7) | Granular | (200) (220) (111) | | | TiCO (0.1) | Granular |
| | 106 | C | | | TiCN (9.8) | Granular | (111) (200) (220) | | | TiCO (0.1) | Granular |
| | 107 | C | TiC (0.4) | Granular | TiCN (2.5) | Granular | (220) (200) (111) | TiN (1.8) | Granular | TiCNO (0.1) | Granular |
| | 108 | C | TiN (0.5) | Granular | TiCN (7.7) | Granular | (111) (200) (220) | | | | |
| | 109 | D | TiN (0.6) | Grqanular | TiCN (6.3) | Granular | (220) (200) (111) | | | TiCNO (0.1) | Granular |
| | 110 | D | TiN (0.7) | Granular | TiCN (2.4) | Granular | (111) (200) (220) | TiCN (1.2) | Granular | | |
| | 111 | D | TiCN (0.5) | Granular | TiCN (8.2) | Granular | (220) (200) (111) | | | | |
| | 112 | D | | | TiCN (6.9) | Granular | (111) (200) (220) | TiC (1.3) | Granular | | |

| Type | | Sub-strate Symbol | Hard Coating Layer | | | | Flank Wear (mm) | |
|---|---|---|---|---|---|---|---|---|
| | | | Outer Layer | | Outermost Layer | | | |
| | | | Composition | Crystal Structure | Composition | Crystal Structure | | |
| Coated Cemented Carbide Cutting Tools of Prior Art | 99 | A | Al$_2$O$_3$ (2.3) | α: 100% | TiN (0.2) | Granular | 0.57 (Chipping) | 0.53 (Chipping) |
| | 100 | A | Al$_2$O$_3$ (2.8) | α: 100% | TiN (0.2) | Granular | 0.61 (Chipping) | 0.52 (Chipping) |
| | 101 | A | Al$_2$O$_3$ (1.9) | κ: 40% | TiCN—TiN (0.6) | Granular | 0.59 (Chipping) | 0.43 (Chipping) |
| | 102 | A | Al$_2$O$_3$ (2.5) | α: 100% | TiN (0.3) | Granular | 0.60 (Chipping) | 0.57 (Chipping) |
| | 103 | B | Al$_2$O$_3$ (3.4) | α: 100% | | | 0.64 (Chipping) | 0.60 (Chipping) |
| | 104 | B | Al$_2$O$_3$ (2.1) | α: 100% | TiN (0.3) | Granular | 0.59 (Chipping) | 0.39 (Chipping) |
| | 105 | B | Al$_2$O$_3$ (3.2) | α: 100% | | | Failure after 21.6 min. due to Layer Separation | Failure after 21.6 min. due to Layer Separation |
| | 106 | C | Al$_2$O$_3$ (1.6) | α: 100% | TiN (0.2) | Granular | Failure after 19.5 min. due to Layer Separation | Failure after 20.8 min. due to Layer Separation |
| | 107 | C | Al$_2$O$_3$ (0.9) | κ: 40% | | | Failure after 15.1 min. due to Layer Separation | Failure after 20.8 min. due to Layer Separation |
| | 108 | C | Al$_2$O$_3$ (2.5) | α: 100% | TiN (0.5) | Granular | Failure after 19.5 min. due to Layer Separation | Failure after 20.8 min. due to Layer Separation |
| | 109 | D | Al$_2$O$_3$ (5.0) | α: 100% | | | 0.59 (Chipping) | 0.54 (Chipping) |
| | 110 | D | Al$_2$O$_3$ | α: 100% | | | Failure after | Failure after |

TABLE 20-continued

|  |  |  |  |  |  | 13.9 min. due to Chipping Failure after 12.4 min. due to Chipping | 3.6 min. due to Fracturing Failure after 5.9 min. due to Fracturing |
|---|---|---|---|---|---|---|---|
|  | 111 | D | Al$_2$O$_3$ (2.9) | α: 100% |  |  |  |
|  | 112 | D | Al$_2$O$_3$ (4.2) | α: 100% | TiN (0.3) Granular | Failure after 11.5 min. due to Chipping | Failure after 6.5 min. due to Fracturing |

TABLE 21

| | | | Hard Coating Layer | | | | | | | |
|---|---|---|---|---|---|---|---|---|---|---|
| | | | Innermost Layer | | Inner Layer | | | First Intermediate Layer | | Second Intermediate Layer | |
| Type | | Sub-strate Symbol | Composition | Crystal Structure | Composition | Crystal Structure | Orientation | Composition | Crystal Structure | Composition | Crystal Structure |
| Coated Cemented Carbide Cutting Tools of Prior Art | 113 | F | TiN (0.3) | Granular | TiCN (3.2) | Granular | (111) (200) (220) | TiCN (1.5) | Granular | TiCO (0.1) | Granular |
| | 114 | F | TiN—TiCN (0.9) | Granular | TiCN (2.1) | Granular | (220) (200) (111) | | | TiCNO (0.2) | Granular |
| | 115 | F | | | TiCN (6.5) | Granular | (111) (200) (220) | TiCN (1.2) | Granular | | |
| | 116 | F | | | TiCN (4.6) | Granular | (200) (220) (111) | | | | |
| | 117 | G | TiC—TiN (1.0) | Granular | TiCN (3.5) | Granular | (111) (200) (220) | | | TiCO (0.1) | Granular |
| | 118 | G | | | TiCN (7.0) | Granular | (220) (200) (111) | | | TiCO (0.1) | Granular |
| | 119 | G | TiN (0.6) | Granular | TiCN (3.1) | Granular | (200) (220) (111) | TiN (1.8) | Granular | | |
| | 120 | G | | | TiCN (3.3) | Granular | (111) (200) (220) | TiC (2.8) | Granular | TiCNO (0.1) | Granular |
| | 121 | G | | | TiCN (4.5) | Granular | (220) (200) (111) | | | | |
| | 122 | E | TiCN (0.5) | Granular | TiCN | Granular | (111) (200) (220) | | | | |
| | 123 | E | TiN (0.3) | Granular | TiCN (2.6) | Granular | (220) (200) (111) | TiC (1.5) | Granular | TiCNO (0.1) | Granular |
| | 124 | E | TiN (0.3) | Granular | TiCN (.35) | Granular | (111) (200) (220) | | | TiCNO (0.1) | Granular |
| | 125 | E' | | | TiCN (3.0) | Granular | (220) (200) (111) | TiCN (0.9) | Granular | | |
| | 126 | E' | TiC (0.8) | Granular | TiCN (2.9) | Granular | (111) (200) (220) | | | TiCNO (0.2) | Granular |

| | | | Hard Coating Layer | | | | |
|---|---|---|---|---|---|---|---|
| | | Sub- | Outer Layer | | Outermost Layer | | |
| | Type | strate Symbol | Composition | Crystal Structure | Composition | Crystal Structure | Flank Wear (mm) |
| Coated Cemented Carbide Cutting Tools of Prior Art | 113 | F | Al$_2$O$_3$ (0.2) | α: 100% | TiN (0.2 | Granular | Failure after 13.6 min. due to Chipping | Failure after 8.0 min. due Fracturing |
| | 114 | F | Al$_2$O$_3$ (0.7) | α: 100% | TiN (0.2) | Granular | Failure after 16.0 min. due to Chipping | Failure after 7.6 min. due to Fracturing |
| | 115 | F | Al$_2$O$_3$ (1.5) | κ: 40% | | | Failure after 14.4 min. due to Chipping | Failure after 3.1 min. due to Fracturing |
| | 116 | F | Al$_2$O$_3$ (1.2) | α: 100% | TiN (0.3) | Granular | Failure after 15.1 min. due to Layer Separation | Failure after 6.3 min. due to Fracturing |
| | 117 | G | Al$_2$O$_3$ | α: 100% | | | Failure after | Failure after |

TABLE 21-continued

| | | | | | | | |
|---|---|---|---|---|---|---|---|
| | | (0.5) | | | | 17.4 min. due to Layer Separation | 5.8 min. due to Fracturing |
| 118 | G | Al$_2$O$_3$ (2.0) | α: 100% | (0.4) | | Failure after 16.2 min. due to Layer Separation | Failure after 4.5 min. due to Fracturing |
| 119 | G | Al$_2$O$_3$ (0.8) | κ: 40% | TiN (0.5) | Granular | Failure after 12.5 min. due to Layer Separation | Failure after 7.4 min. due to Fracturing |
| 120 | G | Al$_2$O$_3$ (1.2) | α: 100% | | | Failure after 13.3 min. due to Layer Separation | Failure after 7.9 min. due to Fracturing |
| 121 | G | Al$_2$O$_3$ (1.0) | κ: 40% | | | Failure after 17.6 min. due to Layer Separation | Failure after 5.2 min. due to Fracturing |
| 122 | E | Al$_2$O$_3$ (0.8) | α: 100% | TiN (0.3) | Granular | 0.41 (Chipping) (Milling) | |
| 123 | E | Al$_2$O$_3$ (0.5) | α: 100% | | | 0.37 (Chipping) (Milling) | |
| 124 | E | Al$_2$O$_3$ (0.4) | α: 100% | TiN (0.2) | Granular | 0.33 (Chipping) (Milling) | |
| 125 | E' | Al$_2$O$_3$ (0.3) | α: 100% | | | 0.38 (Chipping) (Milling) | |
| 126 | E' | Al$_2$O$_3$ (1.1) | α: 100% | TiN (0.2) | Granular | 0.36 (Chipping) (Milling) | |

What is claimed is:

1. A coated hard alloy blade member comprising:
a hard alloy substrate selected from the group consisting of a WC-based cemented carbide and a TiCN-based cermet, and
a hard coating deposited on said substrate, said hard coating comprising an inner layer of TiCN having unilaterally grown crystals of an elongated shape and an outer layer of Al$_2$O$_3$ having a crystal form K or K+α wherein K>α,
wherein said hard coating further includes an innermost layer of one or more granular TiN, TiC, or TiCN formed underneath said inner layer, and
wherein an X-ray diffraction spectrum of the TiCN in said elongated crystals comprises diffraction peaks wherein the peak strength of a (200) TiCN plane is weaker than the peak strength of a (111) TiCN plane and weaker than the peak strength of a (220) TiCN plane.

2. A coated hard alloy blade member according to claim 1, wherein said hard coating further includes an outermost layer of one or both of granular TiN or TiCN formed on said outer layer of Al$_2$O$_3$.

3. A coated hard alloy blade member according to claim 2, wherein said hard coating further includes a second intermediate layer of one or both of TiCO or TiCNO formed between said inner layer of TiCN and said outer layer of Al$_2$O$_3$.

4. A coated hard alloy blade member according to claim 2, wherein said hard coating further includes a first intermediate layer of one or more of granular TiC, TiN, or TiCN formed between said inner layer of TiCN and said outer layer of Al$_2$O$_3$.

5. A coated hard alloy blade member according to claim 4, wherein said hard coating further includes a second intermediate layer of one or both of TiCO or TiCNO formed between said first intermediate layer and said outer layer of Al$_2$O$_3$.

6. A coated hard alloy blade member according to claim 1, wherein said hard coating further includes a first intermediate layer of one or more of granular TiC, TiN, or TiCN formed between said inner layer of TiCN and said outer layer of Al$_2$O$_3$.

7. A coated hard alloy blade member according to claim 6, wherein said hard coating further includes a second intermediate layer of one or both of TiCO or TiCNO formed between said first intermediate layer and said outer layer of Al$_2$O$_3$.

8. A coated hard alloy blade member according to claim 1, wherein said hard coating further includes a second intermediate layer of one or both of TiCO or TiCNO formed between said inner layer of TiCN and said outer layer of Al$_2$O$_3$.

9. A coated hard alloy blade member according to claim 1, wherein said inner layer of TiCN further includes one or more layers of TiN such that the inner layer is divided by the layers of TiN.

10. A coated hard alloy blade member according to claim 9, wherein said hard coating further includes an innermost layer of one or more of granular TiN, TiC, or TiCN formed underneath said inner layer.

11. A coated hard alloy blade member according to claim 10, wherein said hard coating further includes an outermost layer of one or both of granular TiN or TiCN formed on said outer layer of Al$_2$O$_3$.

12. A coated hard alloy blade member according to claim 11, wherein said hard coating further includes a second intermediate layer of one or both of TiCO or TiCNO formed between said inner layer of TiCN and said outer layer of Al$_2$O$_3$.

13. A coated hard alloy blade member according to claim 11, wherein said hard coating further includes a first intermediate layer of one or more of granular TiC, TiN, or TiCN formed between said inner layer of TiCN and said outer layer of Al$_2$O$_3$.

14. A coated hard alloy blade member according to claim 13, wherein said hard coating further includes a second intermediate layer of one or both of TiCO or TiCNO formed between said first intermediate layer and said outer layer of Al$_2$O$_3$.

15. A coated hard alloy blade member according to claim 10, wherein said hard coating further includes a second intermediate layer of one or both of TiCO or TiCNO formed between said inner layer of TiCN and said outer layer of $Al_2O_3$.

16. A coated hard alloy blade member according to claim 10, wherein said hard coating further includes a first intermediate layer of one or more of granular TiC, TiN, or TiCN formed between said inner layer of TiCN and said outer layer of $Al_2O_3$.

17. A coated hard alloy blade member according to claim 16, wherein said hard coating further includes a second intermediate layer of one or both of TiCO or TiCNO formed between said first intermediate layer and said outer layer of $Al_2O_3$.

18. A coated hard alloy blade member according to claim 9, wherein said hard coating further includes an outermost layer of one or both of granular TiN or TiCN formed on said outer layer of $Al_2O_3$.

19. A coated hard alloy blade member according to claim 18, wherein said hard coating further includes a first intermediate layer of one or more of granular TiC, TiN, or TiCN formed between said inner layer of TiCN and said outer layer of $Al_2O_3$.

20. A coated hard alloy blade member according to claim 19, wherein said hard coating further includes a second intermediate layer of one or both of TiCO or TiCNO formed between said first intermediate layer and said outer layer of $Al_2O_3$.

21. A coated hard alloy blade member according to claim 18, wherein said hard coating further includes a second intermediate layer of one or both of TiCO or TiCNO formed between said inner layer of TiCN and said outer layer of $Al_2O_3$.

22. A coated hard alloy blade member according to claim 9, wherein said hard coating further includes a first intermediate layer of one or more of granular TiC, TiN, or TiCN formed between said inner layer of TiCN and said outer layer of $Al_2O_3$.

23. A coated hard alloy blade member according to claim 22, wherein said hard coating further includes a second intermediate layer of one or both of TiCO or TiCNO formed between said first intermediate layer and said outer layer of $Al_2O_3$.

24. A coated hard alloy blade member according to claim 9, wherein said hard coating further includes a second intermediate layer of one or both of TiCO or TiCNO formed between said inner layer of TiCN and said outer layer of $Al_2O_3$.

25. A coated hard alloy blade member according to claim 1, wherein said WC-based cemented carbide consists essentially of W, C, 4–12% by weight of Co, 0–7% by weight of Ti, 0–7% by weight of Ta, 0–4% by weight of Nb, 0–2% by weight of Cr, 0–1% by weight of N.

26. A coated hard alloy blade member according to claim 25, wherein the maximum amount of Co in a surface layer of the substrate ranging up to 100 $\mu$m depth from a surface thereof is 1.5 to 5 times as much as the amount of Co in an interior 1 mm deep from the surface.

27. A coated hard alloy blade member according to claim 1, wherein said TiCN-based cermet consists essentially of Ti, C, 2–14% by weight of Co, 2–12% by weight of Ni, 2–20% by weight of Ta, 0.1–10% by weight of Nb, 5–30% by weight of W, 5–20% by weight of Mo, 2–8% by weight of N, optionally no greater than 5% by weight of at least one selected from the group consisting of Cr, V, Zr, and Hf.

28. A coated hard alloy blade member according to claim 27, wherein hardness in a surface layer of the substrate ranging up to 100 $\mu$m depth from a surface thereof is more than 5% harder than hardness of an interior 1 mm deep from the surface.

* * * * *